US009762027B2

United States Patent
Johnson

(10) Patent No.: US 9,762,027 B2
(45) Date of Patent: Sep. 12, 2017

(54) BEAM STEERING MODULATED VCSEL

(71) Applicant: Finisar Corporation, Sunnyvale, CA (US)

(72) Inventor: Ralph Herbert Johnson, Murphy, TX (US)

(73) Assignee: FINISAR CORPORATION, Sunnyvale, CA (US)

( * ) Notice: Subject to any disclaimer, the term of this patent is extended or adjusted under 35 U.S.C. 154(b) by 69 days.

(21) Appl. No.: 14/698,180

(22) Filed: Apr. 28, 2015

(65) Prior Publication Data

US 2015/0318667 A1 Nov. 5, 2015

Related U.S. Application Data

(60) Provisional application No. 61/986,326, filed on Apr. 30, 2014.

(51) Int. Cl.
*H01S 5/062* (2006.01)
*H01S 5/183* (2006.01)
(Continued)

(52) U.S. Cl.
CPC ........ *H01S 5/06243* (2013.01); *H01S 5/0614* (2013.01); *H01S 5/18302* (2013.01); *H01S 5/0014* (2013.01); *H01S 5/06236* (2013.01); *H01S 5/18311* (2013.01); *H01S 5/423* (2013.01); *H01S 2301/16* (2013.01); *H01S 2301/166* (2013.01)

(58) Field of Classification Search
CPC ............... H01S 5/06243; H01S 5/0614; H01S 5/18302; H01S 5/0014; H01S 2301/166; H01S 5/423; H01S 2301/16; H01S 5/18311; H01S 5/06236
See application file for complete search history.

(56) References Cited

U.S. PATENT DOCUMENTS

| 7,983,572 B2* | 7/2011 | Deng | H01S 5/18302 |
| | | | 398/182 |
| 2012/0093189 A1* | 4/2012 | Fattal | B82Y 20/00 |
| | | | 372/50.11 |

OTHER PUBLICATIONS

Hao Feng, Member, IEEE, J. P. Pang, Student Member, IEEE, M. Sugiyama, Kunio Tada, Fellow, IEEE, and Yoshiaki Nakano, Member, IEEE, Field-Induced Optical Effect in a Five-Step Asymmetric Coupled Quantum Well with Modified Potential, IEEE Journal of Quantum Electronics, vol. 34, No. 7, Jul. 1998, pp. 1197-1208.
(Continued)

*Primary Examiner* — Xinning Niu
(74) *Attorney, Agent, or Firm* — Maschoff Brennan

(57) ABSTRACT

A VCSEL can include: an electro-optic modulator between a lasing active region and a light emitting surface. The electro-optic modulator can include: an electro-optically active region; a modulator mirror region over the electro-optically active region; and at least one electrical insulator region separating the modulator mirror region into at least two separate modulator mirror cavities electrically isolated from each other, wherein each separate modulator mirror cavity and a longitudinally aligned portion of the electro-optically active region form an electro-optic modulator cavity. A method of emitting light from a VCSEL can include: emitting a laser beam from the lasing active region along a longitudinal axis; and changing a refractive index of one electro-optic modulator cavity so as to steer the laser beam from the longitudinal axis.

30 Claims, 27 Drawing Sheets

(51) Int. Cl.
*H01S 5/06* (2006.01)
*H01S 5/00* (2006.01)
*H01S 5/42* (2006.01)

(56) References Cited

OTHER PUBLICATIONS

Jason Thalken, Weifei Li, Stephan Haas, and A.F.J. Levi, Adaptive Design of Excitonic Absorption in Broken-Symmetry Quantum Wells, Jan. 4, 2014, pp. 1-4.

W Q. Chen, S. M. Wang, and T. G. Andersson, Large Stark Shifts of the Interband Transition in Two-step Quantum Wells, IEEE Electron Device Letters, vol. 14, No. 6, June 1993, pp. 286-288.

J. Radovanovic, V. Milanovic, Z. Ikonic and D. Indjin, Quantum-Well Profile Optimization for Maximal Stark Effect and Application to Tunable Infrared Photodetectors, Journal of Applied Physics vol. 91, No. 1 Jan. 1, 2002, pp. 525-527.

Tim David Germann, Werner Hofmann,1 Alexey M. Nadtochiy, Jan-Hindrik Schulze, Alex Mutig, André Strittmatter, and Dieter Bimberg, Electro-Optical Resonance Modulation of Vertical-Cavity Surface-Emitting Lasers, Received Oct. 20, 2011; accepted Jan. 2, 2012; published Feb. 16, 2012, (C) 2012 OSA Feb. 13, 2012 / vol. 20, No. 4 / Optics Express 5099.

\* cited by examiner

BEAM STEERING MODULATED VCSEL

CROSS-REFERENCE

This patent application claims priority to U.S. Provisional Application Ser. No. 61/986,326 filed Apr. 30, 2014, which provisional application is incorporated herein by specific reference in its entirety.

BACKGROUND

Lasers are commonly used in many modern communication components for data transmission. One use that has become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers emit a high optical output representing binary highs and a lower power optical output representing binary lows. To obtain quick reaction time, the laser is constantly on, but varies from a high optical output to a lower optical output.

Optical networks have various advantages over other types of networks such as copper wire-based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. That is, optical networks are able to reliably transmit data at higher rates over further distances than is possible with copper wire networks.

One type of laser that is used in optical data transmission is a Vertical Cavity Surface-Emitting Laser (VCSEL). As its name implies, a VCSEL has a laser cavity that is sandwiched between and defined by two mirror stacks. A VCSEL is typically constructed on a semiconductor wafer such as Gallium Arsenide (GaAs). The VCSEL includes a bottom mirror constructed on the semiconductor wafer. Typically, the bottom mirror includes a number of alternating high and low index of refraction layers. As light passes from a layer of one index of refraction to another, a portion of the light is reflected. By using a sufficient number of alternating layers, a high percentage of light can be reflected by the mirror.

An active region that includes a number of quantum wells is formed on the bottom mirror. The active region forms a PN junction sandwiched between the bottom mirror and a top mirror, which are of opposite conductivity type (e.g., a p-type mirror and an n-type mirror). Notably, the notion of top and bottom mirrors can be somewhat arbitrary. In some configurations, light could be extracted from the wafer side of the VCSEL, with the "top" mirror nearly totally reflective—and thus opaque. However, for purposes of this invention, the "top" mirror refers to the mirror from which light is to be extracted, regardless of how it is disposed in the physical structure. Carriers in the form of holes and electrons are injected into the quantum wells when the PN junction is forward biased by an electrical current. At a sufficiently high bias current the injected minority carriers form a population inversion in the quantum wells that produces optical gain. Optical gain occurs when photons in the active region stimulate electrons in the conduction band to recombine with holes in the valence band which produces additional photons. When the optical gain exceeds the total loss in the two mirrors, laser oscillation occurs.

The active region may also include an oxide aperture formed using one or more oxide layers formed in the top and/or bottom mirrors near the active region. The oxide aperture serves both to form an optical cavity and to direct the bias current through the central region of the cavity that is formed. Alternatively, other means, such as ion implantation, epitaxial regrowth after patterning, or other lithographic patterning may be used to perform these functions.

A top mirror is formed on the active region. The top mirror is similar to the bottom mirror in that it generally comprises a number of layers that alternate between a high index of refraction and a lower index of refraction. Generally, the top mirror has fewer mirror periods of alternating high index and low index of refraction layers, to enhance light emission from the top of the VCSEL.

Illustratively, the laser functions when a current is passed through the PN junction to inject carriers into the active region. Recombination of the injected carriers from the conduction band to the valence band in the quantum wells results in photons that begin to travel in the laser cavity defined by the mirrors. The mirrors reflect the photons back and forth. When the bias current is sufficient to produce a population inversion between the quantum well states at the wavelength supported by the cavity, optical gain is produced in the quantum wells. When the optical gain is equal to the cavity loss, laser oscillation occurs and the laser is said to be at threshold bias and the VCSEL begins to "lase" as the optically coherent photons are emitted from the top of the VCSEL.

The subject matter claimed herein is not limited to embodiments that solve any disadvantages or that operate only in environments such as those described above. Rather, this background is only provided to illustrate one example technology where some embodiments described herein may be practiced.

SUMMARY

In one embodiment, a VCSEL can include: an electro-optic modulator between a lasing active region and a light emitting surface. The electro-optic modulator can include: an electro-optically active region; a modulator mirror region over the electro-optically active region; and at least one electrical insulator region separating the modulator mirror region into at least two separate modulator mirror cavities electrically isolated from each other, wherein each separate modulator mirror cavity and a longitudinally aligned portion of the electro-optically active region form an electro-optic modulator cavity. In one aspect, at least one electrical insulator region includes an electrical insulator trench having an electrical insulator material that is different from the mirror regions. In one aspect, the electrical insulator material of the electrical insulator trench is selected from the group consisting of air, silicon nitride, silicon dioxide, BCB, photoresist, titania or combination thereof. In one aspect, at least one electrical insulator region includes an electrical insulator implant region, wherein the electrical implant region is implanted with a material that causes the electrical implant region to be electrically insulating. In one aspect, the implant region is implanted with protons and/or helium. In one aspect, each modulator mirror cavity has a modulator electrode. In one aspect, the at least two separate modulator mirror cavities are laterally disposed with respect to each other and relative to a longitudinal axis of emitted light.

In one embodiment, an electro-optic modulator can include: the modulator mirror region having a top and a bottom; and the at least one electrical insulator region extending from the top to bottom of the modulator mirror region.

In one embodiment, a VCSEL can include: a delay wave-plate over at least one of the separate modulator mirror cavities, the delay wave-plate providing a relative delay of ¼ wave or odd factor thereof; and at least one of the separate modulator mirror cavities being devoid of a delay wave-plate thereover. In one aspect, the VCSEL can include a delay wave-plate over diagonally located separate modulator mirror cavities when four or more separate modulator mirror cavities are included.

In one embodiment, the electro-optic modulator may be in a mesa region of the VCSEL and the lasing active region being in a base region having a shoulder, the base region having the shoulder being under the mesa region.

In one embodiment, the VCSEL can include more than two separate modulator mirror cavities separated by at least one electrical insulator region. The separate modulator mirror cavities can be horizontally or laterally adjacent with each other.

In one embodiment, a method of manufacturing a VCSEL of one of the embodiments is provided. Such a method can include: forming a semiconductor structure having the lasing active region and a middle mirror region over the lasing active region; forming the electro-optically active region over the middle mirror region; forming the modulator mirror region over the electro-optically active region so as to have a top having the light emitting surface or associated therewith and to have a bottom; and forming the at least one electrical insulator region in the modulated mirror region so as to split the modulated mirror region into the at least two modulated mirror cavities.

In one embodiment, the manufacturing method can include: removing a portion of the modulator mirror region from the top to the bottom so as to form a trench between the at least two separate modulator mirror cavities; and filling the trench with an electrical insulator material so as to form the at least one electrical insulator region in the trench. In an alternative embodiment, the method can include forming the one or more insulator regions by implanting a substance of the modulator mirror region so as to form an implant isolator.

In one embodiment, a method of emitting light from a VCSEL can include: providing a VCSEL of one of the embodiments; emitting a laser beam from the lasing active region along a longitudinal axis; and changing a refractive index of one electro-optic modulator cavity so as to steer the laser beam from the longitudinal axis.

In one embodiment, an operational method can include selectively biasing the one electro-optic modulator cavity so as to change the refractive index thereof relative to one or more other electro-optic modulator cavities. In one aspect, an operational method can include selectively biasing one modulator mirror cavity and a portion of electro-optically active region that is longitudinally aligned with the biased modulator mirror cavity so as to change the relative refractive index. In one aspect, an operational method can include applying an opposite relative bias to one or more other electro-optic modulator cavities. In one aspect, an operational method can include steering the laser beam by at least 5 degrees.

In one embodiment, a delay wave-plate is included over the one electro-optic modulator cavity. As such, a corresponding operational method with such a delay wave-plate can include the delay wave-plate further steering the laser beam from the longitudinal axis. Such further comparing can be against a similar VCSEL without a delay wave-plate and operation thereof.

In one embodiment, the operational method can include providing a VCSEL having four or more electro-optic modulator cavities; and biasing diagonally-opposed electro-optic modulator cavities with a first bias without biasing other electro-optic modulator cavities with the first bias. In one aspect, the operational method can include biasing other electro-optic modulator cavities with a second bias while biasing the diagonally-opposed electro-optic modulator cavities with the first bias, wherein the second bias is opposite of the first bias relative to some nominal bias.

In one embodiment, an operational method can include providing a VCSEL having a delay wave-plate over one or more of the electro-optic modulator cavities; and phase shifting light emitted from one or more of the electro-optic modulator cavities compared to another one or more of the electro-optic modulator cavities. In one aspect, the phase shifting is about 180 degrees.

In one embodiment, an operational method can include converting the fundamental mode to at least a first angular mode. In one aspect, an operational method can include converting the fundamental mode to at least a second angular mode.

In one embodiment, an operational method can include providing a VCSEL having a delay wave-plate over one or more of the electro-optic modulator cavities; and compensating for the delay wave-plate by an applied field to the electro-optic modulator to obtain about 0 phase change.

In one embodiment, an operational method can include one or more of: modulating bias of the one electro-optic modulator cavity to change the refractive index of the one electro-optic modulator cavity; varying slope efficiency with applied bias to the one electro-optic cavity while current bias applied to the primary VCSEL cavity is modulated to keep photon density in a primary VCSEL cavity nominally constant; or varying slope efficiency with applied bias to the one electro-optic cavity while current bias applied to a primary VCSEL cavity is modulated to minimize ringing in a modulated signal emitted from the VCSEL.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and following information as well as other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

Figure 1:
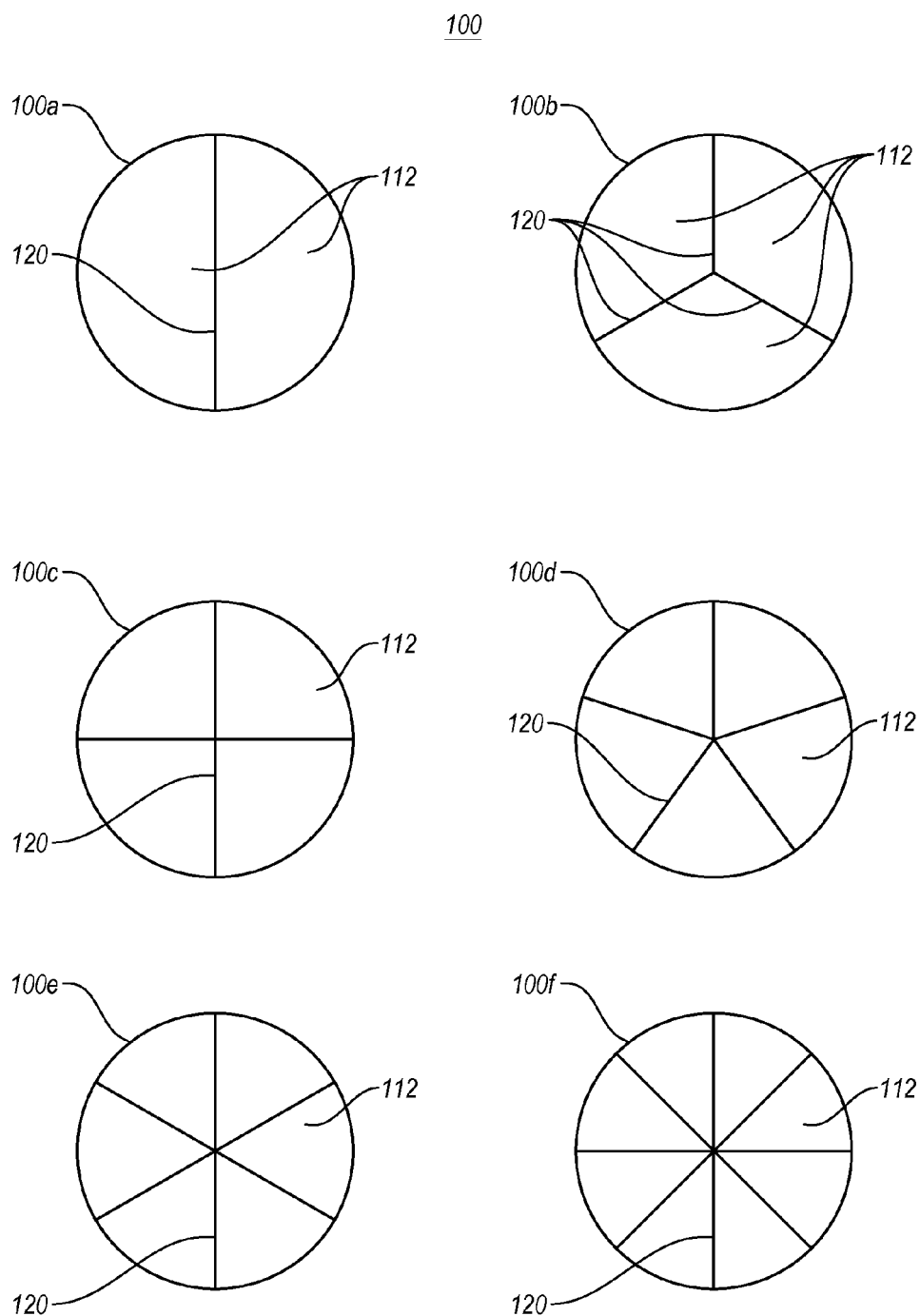
FIG. 1 shows top views of various embodiments of multi-cavity electro-optic modulator VCSELs that have shaped electro-optic modulator cavities defined by insulators.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Generally, the present invention includes a beam steering multi-cavity vertical cavity surface emitting laser ("VCSEL") with comparatively faster data modulation than single cavity VCSELs. The VCSEL is created with two or more beam steering electro-optic modulator cavities that are laterally or horizontally adjacent with respect to a longitudinal or vertical axis (e.g., light emitting axis) and configured so that the light emitted from one cavity is out of phase with the light emitted from the other cavity, which causes beam steering and, with various forms of filtering, data modulation. The VCSEL having the multi-lateral electro-optic modulator cavities in the beam steering configuration can provide a data stream with a data modulation bit rate that is significantly faster than a single cavity design. The VCSEL having the multi-lateral electro-optic modulation cavities in the beam steering configuration can have a fast data modulation bit rate that may only be limited by the resistance/capacitance (RC) delays, which can be a very small limitation, resulting in a fast data modulating VCSEL.

The VCSEL device uses two or more laterally or horizontally separate and adjacent electro-optic modulator cavities that are configured to steer the beam so as to prevent or significantly reduce any variation in the reflection back to the primary laser cavity currently emitting the light. That is, the photon density in the primary laser cavity is nearly unchanged from back reflected light. As a result, the VCSEL can implement beam steering at a very fast rate for data modulation, which is limited only by the RC time constants and without significant variation in back reflection, where the data modulation is not limited by the gain dynamics, which limit the speed of conventional direct modulated lasers.

The beam steering electro-optic modulator can include different modulator cavities that can be created by a region in a top mirror of the VCSEL being divided with an insulator, where the divided region (e.g., both sides of the insulator) are each electronically coupled to an electro-optically active region. The insulator bisected mirror and electro-optically active region form the beam steering electro-optic modulator. As such, the beam steering electro-optic modulator region of the VCSEL can include two or more electro-optic modulator cavities separated by one or more insulators and located over the electro-optically active region. The insulator can be any insulating material that is located within the top mirror of a VCSEL, which in some embodiments the insulators can be aligned with the longitudinal axis and oriented to divide the mirror to form two or more laterally or horizontally adjacent mirror cavities that operate as modulator cavities.

In one aspect, the modulator cavities are not longitudinally aligned or adjacent, but are side-by-side so as to be laterally or horizontally adjacent. One or more discrete insulators can be used depending on the number of modulator cavities to be created as well as the shape of the modulator cavities to be created. The one or more insulators can be thin members or thin sheets or thin air spaces or thin gaps within the mirror that are vertically oriented to form side-by-side modulator cavities and to electronically insulate the mirror regions of the modulator cavities from each other. The insulators can each be a divider to form different mirror regions for the modulator cavities in a top mirror region that is adjacent to a light emitting surface. The insulators can be located at various regions within the mirrors of the VCSELs described herein. In one example, the insulator can penetrate downwardly from a top mirror top surface to a predetermined location in the top mirror or all the way through the top mirror to the electro-optically active region. The electro-optically active region is distinguished from the light emitting active region (e.g., lasing active region) that emits the laser light.

In one aspect, the insulators can extend from a top surface of a top mirror or top region near the optical emitting surface down into the upper mirror of the VCSEL. The insulator may extend down to an electro-optically active region. An electro-optically active region can have substantially the same cross-sectional profile as the insulator-divided top mirror, and may have the same cross-sectional dimensions as one, a plurality, or the entire mirror cavities. For example, an electro-optically active region can extend across a mesa to have the same cross-sectional profile as the mesa, or can extend across a semiconductor region of a VCSEL cross-section to have the same cross-sectional profile as the semiconductor region, or can extend across an epitaxial region of a VCSEL cross-section to have the same cross-sectional profile as the epitaxial region. The electro-optically active region may be below the multi-cavity mirror region so as to be electronically coupled thereto, which can include direct contact between the electro-optically active member and multi-cavity mirror region.

In one embodiment, the VCSEL can include a beam steering electro-optic modulator having multiple independent resonant coupled cavities, all of the resonant coupled cavities being optically coupled with the same electro-optically active region that can have its index of refraction changed by applied bias. The electro-optically active region can be placed within the VCSEL between the multiple independent resonant coupled cavities and a mirror region that is over the lasing active region. The multiple independent resonant coupled cavities can be achieved by the top mirror being split into two or more separate cavities by one or more insulating regions so that the individual cavities can be biased separately. Accordingly, if there is "n" insulators, there are "n+1" resonant coupled cavities. As such, each cavity can include an independent electrode to facilitate such bias of the electro-optically active material for that cavity. The individual cavities can be biased separately in order to cause a change in refractive index compared to the other cavity or cavities, which causes steering of the optical beam.

In one embodiment, the VCSEL can include a beam steering electro-optic modulator having multiple independent resonant coupled cavities, all of the resonant coupled cavities being optically coupled with the same primary lasing active region where each electro-optically active region within the resonant coupled cavities can have its index of refraction changed by applied bias. The multiple electro-optically active regions can be placed within the VCSEL inside the multiple independent resonant coupled cavities and a mirror region that is over the lasing active region and can serve as the lower mirror of the coupled cavities. The multiple independent resonant coupled cavities are achieved by the top mirror of the top cavity being split into two or more separate cavities by an insulating region so that the individual cavities can be biased separately. The insulating region may also separate the different electro-optically active regions. Each optically active region can include its own electrode for facilitating the bias. As such, each cavity can include an independent electrode to facilitate such bias for each optically active region. Accordingly, each electro-optically active region may be associated with an electrode to create the bias and change the refractive index. The individual cavities can be biased separately in order to change in refractive index compared to the other cavity or cavities, which causes steering of the optical beam.

The different electro-optic modulator cavities can have a different bias (e.g., bias versus no bias, high bias versus low bias, etc.) in order to change the angle of the beam emitted from the VCSEL. For example, a two-cavity electro-optic modulator embodiment can be configured to perform optical beam steering in a manner to steer the beam, such as +/−6 degrees for example. When more cavities are used, the angle of beam steer may stay the same or change. The change in the angle of the beam by beam steering does not change back reflection into the cavity emitting light significantly. Also, fields are reasonably symmetric in the laser section so that the multi-cavity configuration can be employed in a VCSEL.

The multi-cavity electro-optic beam steering modulator can provide the VCSEL with improved modulation properties. A reverse biased quantum well Stark shift based active region that is substantially non-absorbing can be beneficial to avoid transit time and escape time problems common to electro-absorption modulators. Changing the angle of the optical beam by beam steering can reduce or inhibit changes in back reflection, but still allow for a resonant modulator. The beam steering does not require significant phase change, which allows the VCSEL to operate further away from the absorption edge of the modulator compared to other electro-absorption and electro-optic modulators, which improves temperature stability in the multi-cavity electro-optic modulator-containing VCSEL. The improved temperature stability allows for operation of the multi-cavity electro-optic modulator-containing VCSEL at comparatively higher temperatures.

FIG. 1 shows top views of various embodiments of the multi-cavity electro-optic modulator VCSELs 100 that have shaped electro-optic modulator cavities 112 defined by the insulator 120. The embodiments are as follows: two cavity electro-optic modulator 100*a*; three cavity electro-optic modulator 100*b*; four cavity electro-optic modulator 100*c*; five cavity electro-optic modulator 100*d*; six cavity electro-optic modulator 100*e*; and eight cavity electro-optic modulator 100*f*. However, any integer number of electro-optic modulator cavities 112 can be created with the corresponding number of insulators 120. While an even number of electro-optic modulator cavities can be preferred in some instance, odd numbers of electro-optic modulator cavities can also be useful. While the electro-optic modulator cavities 112 are shown to have substantially the same cross-sectional area per embodiment, the electro-optic modulator cavities 112 can be asymmetrical and have different cross-sectional areas with respect to each other. Also, the intersection of the electro-optic modulator cavities may be centered, off-center, or asymmetrical. Additional embodiments may also be obtained under the principles of the invention described herein. Also, the insulators 120 may not intersect, or the electro-optic modulator cavities 112 may extend across from one edge to an opposite edge, or they may be partitioned in grids, rows, or columns. Also, the insulators 120 may all intersect at a point, such as on an edge. A checkerboard embodiment may also be possible with fabrication that provides an electrode contact to a center electro-optic modulator cavity 112.

Each electro-optic modulator cavity 112 is electronically coupled to an individual electrode such that each cavity 112 can emit light phased independently of the other cavities. Central electro-optic modulator cavities 112 that do not contact an edge or perimeter, or any cavity, can be electrically biased with transparent or optically transmissive electrical contacts or electrodes, where the electricity is provided by a transparent electrically conductive member. The electrodes can be configured as standard VCSEL electrodes that are operably coupled to top mirrors, and where the VCSEL has a bottom electrode. Alternatively, the electro-optic modulator cavities 112 can each individually have modulator specific modulator electrodes that are different from the electrodes that drive lasing in the lasing active region of the VCSEL.

A pattern may also be used, wherein the output of the electro-optic modulator cavities can provide a signature or angular momentum to the combined output beam. The modulation of the electro-optic modulator cavities 112 can be used to modulate the data onto the emitted light with angular momentum as the data carrying entity instead of or in addition to intensity modulation. A spatial filter can be used to convert the angular momentum into intensity modulation if desired. While the cross-section of the multi-cavity electro-optic modulator VCSELs 100 is shown to be circular, other shapes can be used, such as oval, circular, triangle, square, rectangle, pentagram, octagon, or polygon, or combination thereof. In some embodiments, the cross-sectional profile can have a long dimension and a short dimension, where the insulators 120 can be across the long direction or the short direction, or at any location or angle therebetween. In one aspect, the cross-section is oval, and a single insulator 120 is across the long dimension (e.g., across the longer lateral axis).

The relative cross-sectional dimensions of the electro-optic modulator cavities 112 and insulators 120 can vary. The cross-sectional dimensions of the insulators 120 can vary in width and thickness, which can depend on the shape of the electro-optic modulator cavities 112. The thickness of the insulators can vary from 0.1 microns to about 3 microns, from 0.5 microns to about 2 microns, or about 0.5 microns to about 1 micron. The height or length of the electro-optic modulator cavities 112 can extend from about the light emitting surface to the electro-optically active area or include the electro-optically active region, which height or length can vary with different designs. The insulators 120 are configured to create unique electro-optic modulator cavities 112, and as such the insulators 120 can extend from side-to-side of the cross-section of a VCSEL, and have one or more intersections to form two or more different unique electro-optic modulator cavities 112 that have at least one electrical terminal electronically isolated from each other.

The insulators 120 can be any insulating material, such as air, oxygen, nitrogen, insulating gas, silicon nitride, silicon dioxide, benzocyclobutene (BCB) or other insulating material. Also, proton implant or other damage implant into the semiconductor top mirror can be used as the insulator 120. This is the preferred method because of the small optical discontinuity. The implant dose and energy profile should generally be minimized to keep absorption low. Also dopant implants such as beryllium, zinc silicon, selenium, or tellurium implants can be used to create junction isolation, such as insulator 120. Accordingly, any insulating material that inhibits current flow can be used for the insulator 120. Also, photoresist material can be used for the insulating material of the insulator 120.

Figure 2A:
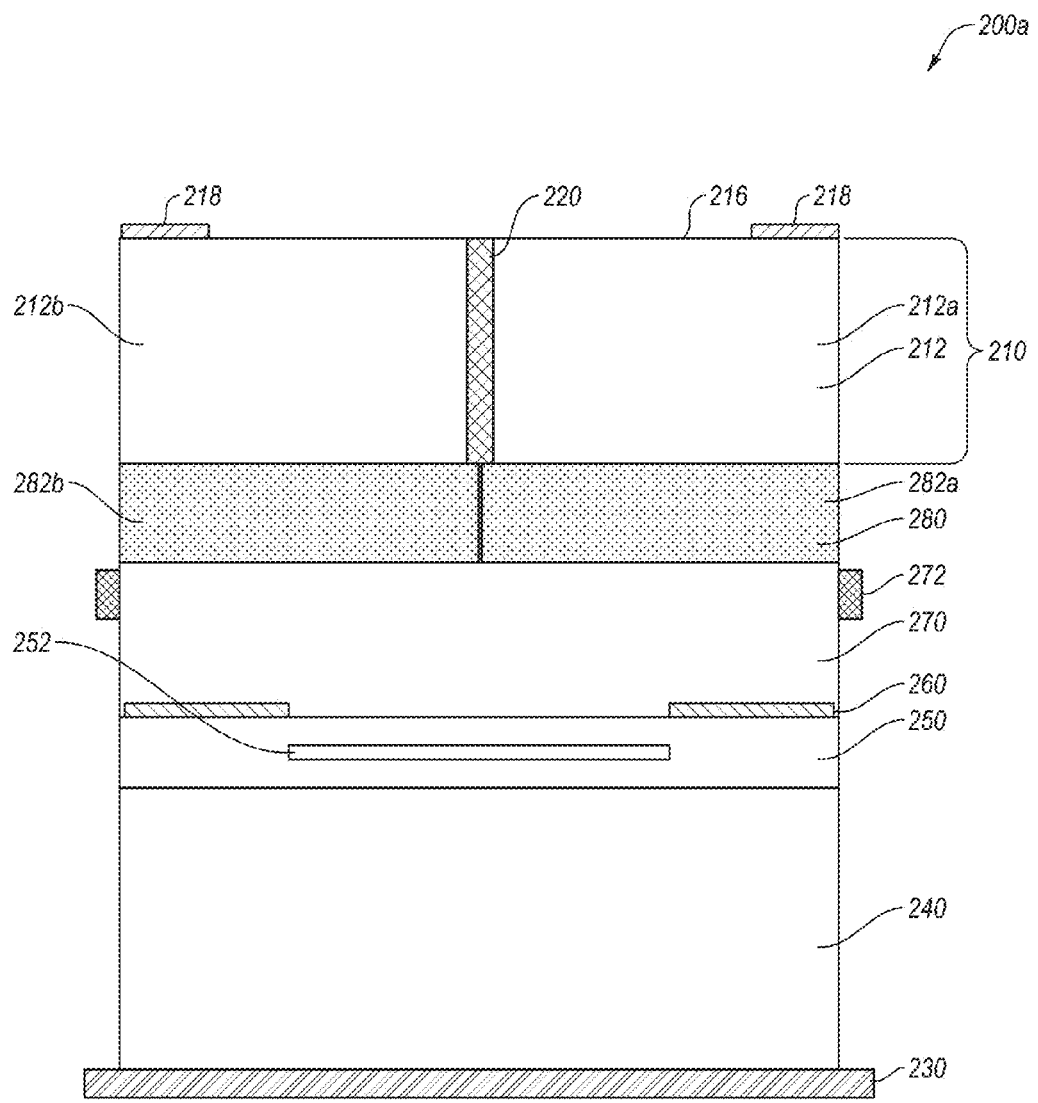
FIG. 2A illustrates a general embodiment of a multi-cavity electro-optic modulator VCSEL.

FIG. 2A illustrates a general embodiment of a multi-cavity electro-optic modulator VCSEL 200a in accordance with the invention described herein. From bottom to top, the multi-cavity electro-optic modulator VCSEL 200a is shown to have: a bottom electrode 230; bottom mirror region 240 on the bottom lasing electrode 230; a lasing active region 250 having a lasing quantum well region 252 on the bottom mirror region 240; an oxide aperture formed by annular oxide member 260 over the lasing active region 250, a middle mirror region 270 over the oxide aperture formed by annular oxide member 260, an electro-optically active region 280 over the middle mirror region 270, a top mirror region 210 over the electro-optically active region 280; an insulator 220 located in the top mirror region 210 to form one or more distinct mirror cavities 212 (e.g., electro-optic modulator cavities 112); a top surface 216 over the top mirror region 210 and insulator 220; and a modulator electrode 218a,b for each mirror cavity 212 on the top surface 216 and electrically coupled with the mirror cavity 212. As shown, there is one insulator 220 forming two mirror cavities 212, and two modulator electrodes 218a,b, with one electrode 218a,b for each mirror cavity 212. However, it is apparent that any number of mirror cavities 212 and electrodes 218a,b can be included. The middle mirror region 270 can also be electrically coupled to an electrode 272 (e.g., annular, C-shaped, etc.) for driving the lasing active region 250.

However, one or more layers or regions common in VCSELs may be located between the components, members, layers, or regions of the multi-cavity electro-optic modulator VCSEL 200a that are illustrated and described herein. For example, the lasing quantum well region 252 can include quantum well layers, barrier layers, transitional layers, or other features known or developed for quantum wells. The components, members, layers, or regions of the multi-cavity electro-optic modulator VCSEL 200a can be prepared by materials common with VCSELs, including the: bottom lasing electrode 230; bottom mirror region 240; lasing active region 250; oxide aperture 260, middle mirror region 270, top mirror region 210; insulator 220; top surface 216; and modulator electrodes 218a,b. The insulator 220 can be any electrically insulating material.

In one embodiment, the insulator 220 is located in the top mirror region 210 to form the plurality of insulated mirror sections 212a, 212b and there is an insulator (not shown) in the electro-optically active region 280. The electro-optically active region 280 is divided into different electro-optical cavities for each modulator mirror cavity 212a, 212b. The different cavities of the electro-optically active region 280 can be the same material or different from each other. The insulator 220 in the electro-optically active region 280 can be the same material or different from the insulator 220 in the top mirror region 210, and they may be connected, integrated, or separate from each other. The same insulator 220 can be in the top mirror region 210 and in the electro-optically active region 280.

The oxide aperture is defined by an optical confinement oxide member 260. The active region 250 includes one or more lasing quantum well region 252, which extend across the cross-sectional profile of the VCSEL 200a.

The top mirror region 210 can be configured as an upper modulator mirror region. The middle mirror region 270 can be configured as both an upper laser mirror region and lower modulator mirror region. The bottom mirror region 240 can be configured as a lower laser mirror region. All the layers above the lasing quantum wells 252 of the lasing active region 250 constitute the upper mirror of the laser. All the layers below the electro-optically active region 280 and above the lasing active region 250 constitute the lower mirror of the beam steering region. All the layers above the electro-optically active region 280 constitute the upper mirrors of the beam steering region. The electrode 272 can be annular, "C" shape, or any other reasonable shape around the perimeter of the VCSEL 200b.

The electro-optically active region 280 can be prepared from any material commonly used to prepare quantum wells or any other suitably electro-optic material. In one example, the electro-optically active region 280 can be a plurality of quantum well layers stacked or layered on top of each other to obtain a desired thickness, which can be about a micron. The difference being that the quantum wells of the lasing active region 250 being forward biased quantum wells and the electro-optically active region 280 have quantum wells that are reverse biased, as well as other structural differences. In the lasing active region 250, the electrons and holes recombine to emit light. In electro-optically active region 280, the reverse bias does not generate emitted light, but changes the index of refraction of the electro-optically active region or region cavities thereof. While there is a single electro-optically active region 280 in the VCSEL 200a of FIG. 2A, the insulating nature of this region under reverse bias or slight forward bias causes the electric field across it to be controlled independently by the potentials between mirror cavity 212a and electrode 272 (for region 282a) on one side and mirror cavity 212b and electrode 274 (for region 282b) on the other side. This bias selectively allows for a portion of the electro-optically active region 280 to change refractive index compared to the other portions that are biased differently. Accordingly, insulators 220 in the electro-optically active region 280, are optional, and may be used in some embodiments but not in other embodiments. When used, one electro-optically active cavity 282a corresponds with mirror cavity 212a, and another electro-optically active cavity 282b corresponds with mirror cavity 212b, which can include the same or similar cross-sectional profiles.

The insulator 220 has a sufficient thickness and is located in the top mirror region 210 so that electrons do not flow between adjacent mirror cavities 212a, 212b. The alternating bias to the different sides of the top mirror region 210, and thereby alternating bias to the different mirrors 212a, 212b causes a relative index change in the electro-optic material of the electro-optically active region 280, and thus a relative phase change to the light emitted at the top surface of the different mirror cavities 212a, 212b. The relative phase change causes the emitted beam to change its angle of emission. The bias is alternated through the two or more mirror cavities 212a, 212b so that the light is emitted from the different mirrors 212a, 212b with different phases. This causes the emitted light to have an angle with respect to the longitudinal axis of the VCSEL 200a, which causes the emitted beam to be steered with respect to the central longitudinal axis. The beam steering can be caused by the reverse bias to the electro-optically active region 280, which causes different fields to form across it.

The selective bias can be obtained by each mirror cavity 212a, 212b having an independent electrode 218a, 218b. The selective bias to the first electrode 218a allows a first electro-optically active cavity of the electro-optically active region 280 having a higher index of refraction, and the higher index of refraction is relative to the lower index of refraction of the other electro-optically active cavity that does not have a reverse bias. Accordingly, the material of the electro-optically active region 280 can have a low index of refraction and then have a higher index of refraction with the bias.

In one aspect, a VCSEL having two distinct electro-optic modulator cavities can be configured for data modulating onto the emitted beam by beam steering from the differently phased electro-optic modulator cavities. That is, each electro-optic modulator cavity emits light at a different phase compared to the other electro-optic modulator cavity. In one example, the angle from a first set of biases on the electro-optic modulator cavities is about +6 degrees and the angle with the complementary set of biases on the other electro-optic modulator cavities is −6 degrees so that there is a 12 degree variance between the light beams emitted due to the different biases on the electro-optic modulator cavities. This beam angle variance can be used for modulating data with various kinds of filters, including spatial and numeric aperture filters.

In one aspect, a VCSEL having three or more (e.g., 4, 6, 8, etc.) distinct electro-optic modulator cavities can be configured for beam steering and to impart a different angular momentum to beam. The VCSEL having three or more distinct electro-optic modulator cavities can be configured as a light beam angular momentum changing system. The different relative angles of the different distinct electro-optic modulator cavities impart a different angular momentum to each emitted light beam, which can be used for data modulation. A change in angular momentum is a change in the mode structure, for example a fundamental mode with a single peak at the center can be transformed into a dumbbell shaped mode. Here, each unique angular momentum can have unique data modulated into the emitted light beam. As such, the VCSEL can have a mode switcher that changes the angular momentum depending on which electrode receives bias for its electro-optic modulator cavity. Accordingly, "n" insulators can be used to create "n+1" electro-optic modulator cavities, where "n" is an insulator equal to or greater than 1. The different electro-optic modulator cavities can each have a unique angular momentum, and thereby each electro-optic modulator cavity can be its own channel.

In one embodiment, the different electro-optic modulator cavities each have at least a portion thereof that is aligned with the optical aperture that is defined by the optically-confining annular region defined by the oxide aperture. That is, the aperture defined by the annular oxide member 360 may be vertically aligned with a portion of each electro-optic modulator cavity. As such, each electro-optic modulator cavity may advantageously intersect in the middle or at a point that is vertically aligned with the optical aperture of the optically-confining annular region. Thus, the different photon angular momentum can provide modulated data communications.

In one embodiment, the top of the VCSEL includes two or more electrical contacts or electrodes in the top mirror region so that the top mirror region functions as the upper modulator mirror region, where each electro-optic modulator cavity includes its own electrical connector. The two or more electrical contacts can be spot contacts, annular contacts, or "C" shaped contacts, or any shape that conforms with the shape of the electro-optic modulator cavities. As shown in FIGS. 2G-2I, the insulator material can be placed between each of the individual cavity electrodes so as to provide electrical isolation therebetween. These electro-optic modulator cavity electrodes allow electrons or holes to be passed through the mirror cavities to the electro-optically active region and/or electro-optic modulator cavities, which allows for an electric field in the electro-optically active region and/or electro-optic modulator cavities. The electric field can run between the independent mirror cavity sections and the lower modulator mirror region and/or upper laser mirror region. Accordingly, the mirror region below the electro-optically active region is conductive, and may be a uniform mirror region. As such, the top mirror region 210 (e.g., upper modulator mirror) can be N-doped, the middle mirror region 270 (e.g., lower modulator mirror region and/or upper laser mirror region) can be P-doped, and the bottom mirror region 240 can be N-doped. Alternatively, the top mirror region 210 can be P-doped, the middle mirror region 270 (e.g., lower modulator mirror region and/or upper laser mirror region) can be N-doped, and the bottom mirror region 240 can be P-doped. This allows for the top and bottom mirror regions to be a first type with the middle mirror region being the opposite type. In one option, the substrate for the lower mirror region can be the bottom contact. Accordingly, the VCSEL can have a number of contacts, the middle and bottom contacts for generating the laser, with the top contacts for modulating the signal by beam steering. As such, the VCSEL can have m+2 electrodes, where m is an integer of the number of functional electro-optic modulator cavities.

In FIG. 2A, the electro-optically active region 280 includes a central member, which can be an insulator. As such, the electro-optically active region 280 can include the same or different material or member for each mirror cavity 212a, 212b. As shown, the first mirror cavity 212a can include a first electro-optically active cavity portion and the second mirror cavity 212b can include a second electro-optically active cavity portion. These electro-optically active cavities can be of the same or different material. They may be separated by an insulating member or they may be adjacent and/or touching without the insulator. When different materials, the electro-optically active cavities 282a,b can have different refractive indices or electro-optic coefficients. However, in most instances the electro-optically active region 280 is a single material, and the electro-optically active cavities 282a, 282b are characterized by more or less relative electrical bias. In one aspect, a simulation can be run to simulate the embodiments of the invention, where the vertical member can separate the electro-optically active region 280 into multiple refractive indices. In one aspect, the electro-optically active region 280 can include depletion layers with no carriers extending inward from the edge, and the vertical line represents a real or theoretical intersection of the depletion layers that extend from the sides.

Figure 2B:
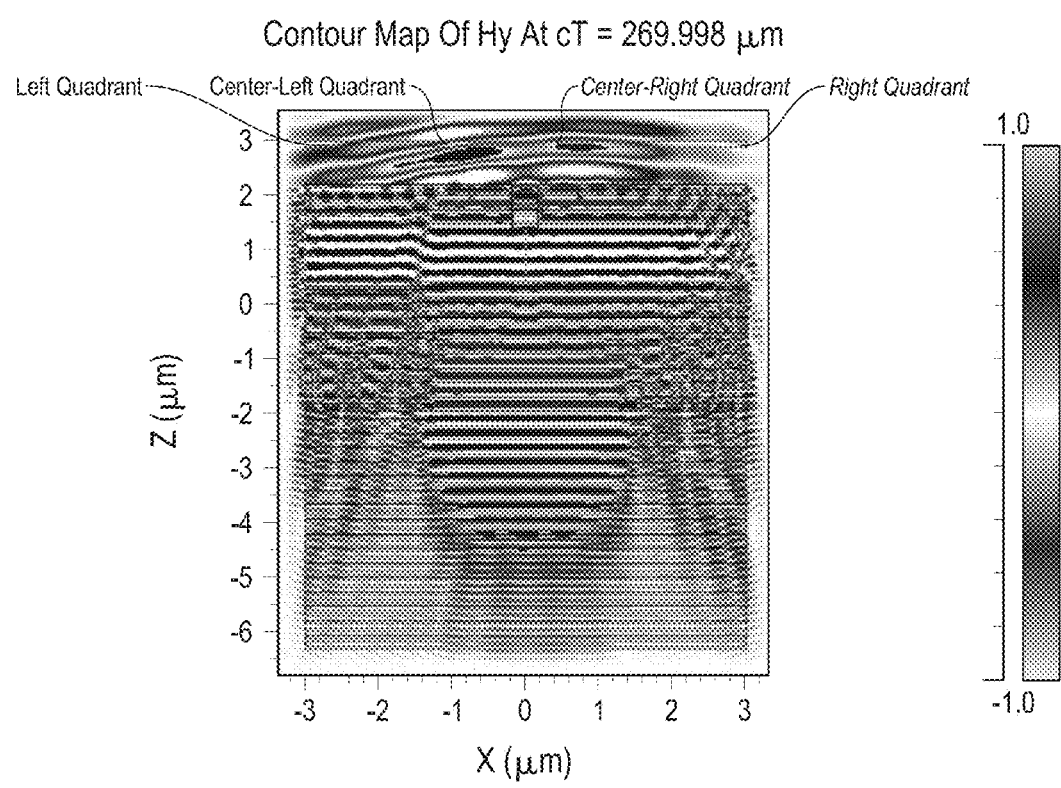
FIG. 2B includes a contour map obtained by 2D simulation results of an exemplary electro-optic modulator VCSEL having two electro-optic modulator cavities that have a single electro-optically active region.

FIG. 2B illustrates a contour map obtained by 2D simulation results of an exemplary electro-optic modulator VCSEL having two electro-optic modulator cavities that have a single electro-optically active region. The 2D simulation shows beam steering with an air insulator in the electro-optic modulator, where the air insulator is configured as an air trench isolator. The contour map shows the component of the magnetic field is effectively pointing outward from the sheet plane so that the contours point outwards, which shows the contours as the E-fields being warped because the index of refraction of each side of the electro-optic modulator is different from the other. This shows a simulation with two different electro-optic modulator cavities, which causes an index of refraction difference between the two different electro-optic modulator cavities. The top of the contour map shows the fields being asymmetrical and pointing more to the left, which shows that the emitted light has an angle, which is from the beam steering effect. The data provides that steady-state can be achieved in about 9 picoseconds, which accounts for photon travel.

Figure 2C:
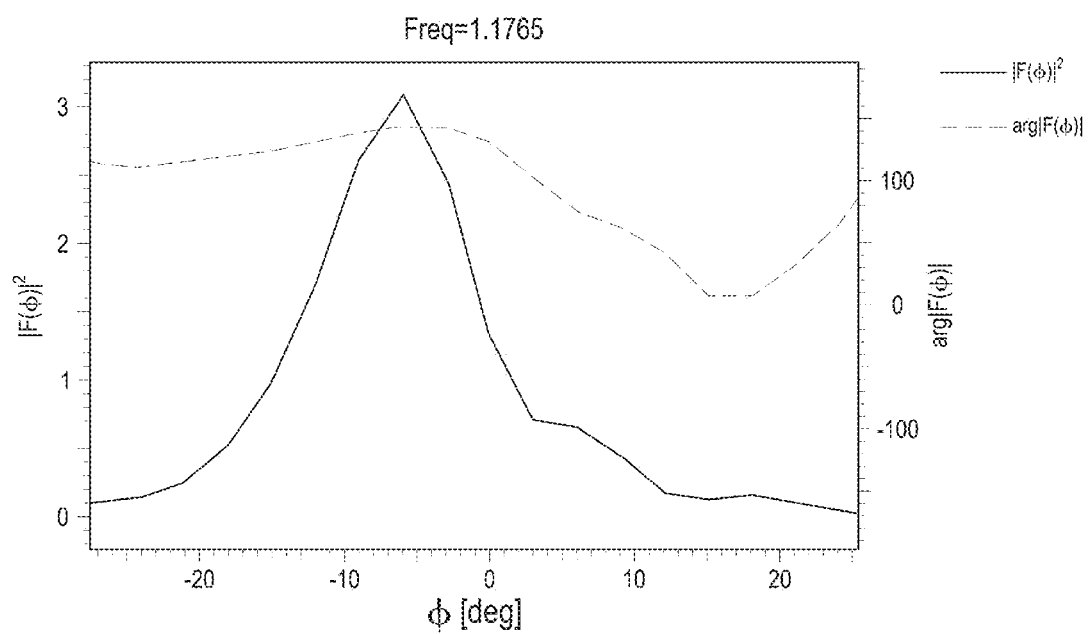
FIG. 2C includes a graph that includes simulation data for the far field and beam steering of about 5.5 degrees for the VCSEL used to obtain the data for FIG. 2B.

FIG. 2C illustrates simulation data for the far field and beam steering of about 5.5 degrees for the VCSEL used to obtain the data for FIG. 2B. The graph shows the left side, which is mirrored for the other side (not shown). As such, the full VCSEL simulation data has this graph for the left side and another mirrored graph for the other side. The data shows about a 110 degree phase shift, which indicates some mode conversion with a 0.01 index change. The data shows how the intensity varies as a function of angle, which shows the location of the peak. The $F\Phi^2$ is the intensity, which is about −6 degrees at the peak. The data shows the power to be symmetrical at the quantum wells, but asymmetrical at the power monitors. The data for the quantum wells being symmetric indicates that the light that is reflected back from the two-cavity electro-optic modulator is symmetric, which indicates reduced back reflection sensitivity since either state of the modulator produces the same back reflected light. Operating the VCSEL by alternating the bias to the two different mirror cavities cause the intensity $F\Phi^2$ for the far field pattern from the combination of cavities to peak at −6 degrees then alternate to +6 degrees which switches back and forth between −6 and +6 degrees as the VCSEL emits light. This change shows the beam emitted from the VCSEL to be steered between −6 to +6 degrees, which shows the beam steering. Thus, the alternating modulation of the bias between the two cavities causes the beam to be steered between +/−6 degrees in the far field.

Additional data indicates the power obtained at different power monitors located in the VCSEL and identified with respect to the contour map of FIG. 2B. The power monitors are identified as the left, center-left, center-right, and right, moving from left to right over the VCSEL so as to monitor emitted light. The left monitor monitors the entire left half, the right monitor monitors the entire right half, and the central monitors monitor the left and right central quadrants. The ratio of the left and right monitor data provides the modulation ratio. The data indicates the two-cavity electro-optic modulator VCSEL provides significant modulation.

Figure 2D:
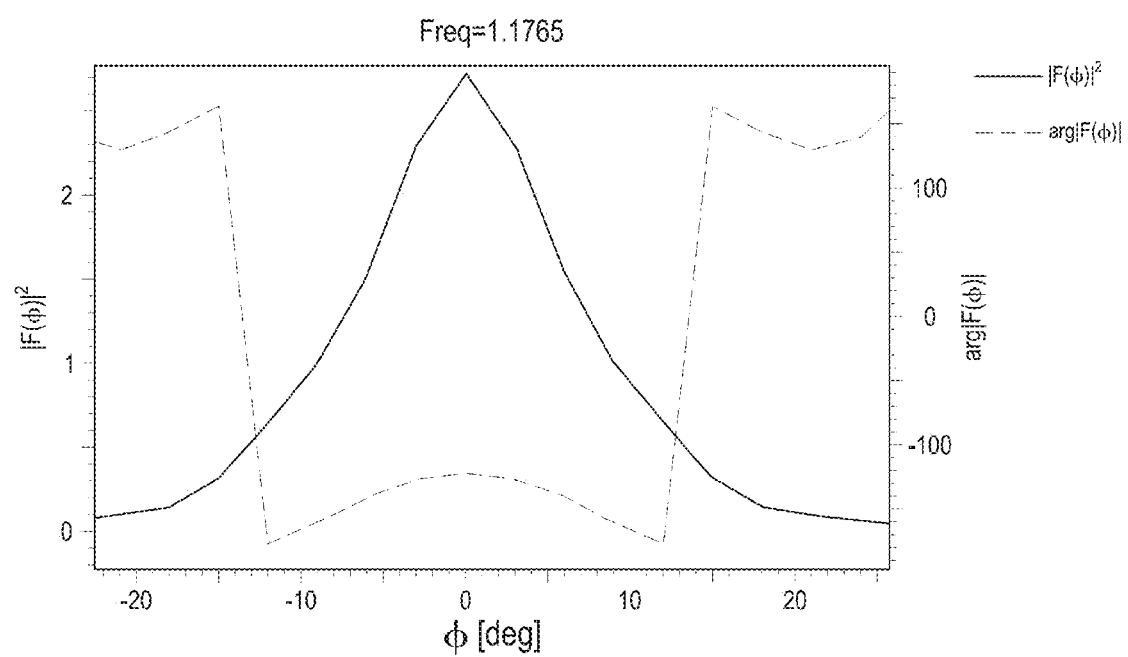
FIG. 2D includes a graph that shows the intensity data that is comparable to FIG. 2C; however, in FIG. 2D there is no applied field to the electro-optic modulator and no extra delays are observed on either side.

FIG. 2D shows intensity data that is comparable to FIG. 2C; however, in FIG. 2D there is no applied field to the electro-optic modulator and no extra delays are observed on either side. As shown, the far field is symmetric and fundamental when no bias is applied to the electro-optic modulator. There is no change in the beam angle, and thereby no beam steering. Here, when the electro-optic modulator has no field, it operates without beam steering and similar to a single cavity VCSEL.

Figure 2E:
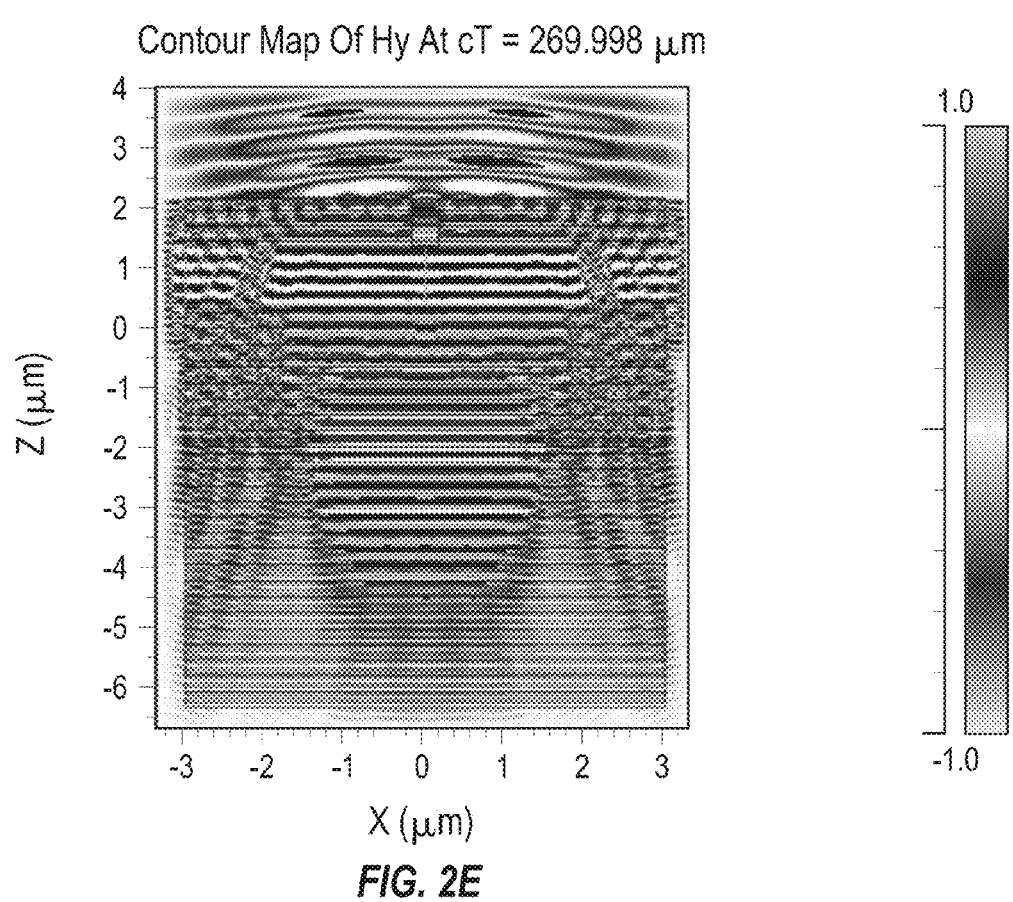
FIG. 2E includes a contour map when there is no applied field to the electro-optic modulator, and there are no extra delays observed on either side.

FIG. 2E shows the contour map when there is no applied field to the electro-optic modulator, and there are no extra delays observed on either side. Similar to the data of FIG. 2D, when no field is applied to the electro-optic modulator, the VCSEL functions similarly to a single cavity VCSEL. Here, the light is not bent and is symmetrical from the emitting surface.

The operating conditions of the electro-optic modulator VCSEL can vary based on design. However, such design can be configured to reduce parasitic reduction in performance. The operating conditions can include about a three volt swing, which can provide about plus or minus six degrees of steering. The capacitance can be small due to the cross-sectional area of the light emitting cavity, and as most of the capacitance problems are from parasitics. The resistance can be small, such that the RC was calculated to be about 50 femtoseconds. This allows for fast modulation on the order of 50 femtoseconds.

For an exemplary VCSEL having a two-cavity electro-optic modulator, the following operational parameters were simulated. With about 1 micron thick electro-active region and 30 KV/cm, a 3 volt swing is useful, which can provide about 0.02+/−0.01 change in refractive index, and about +/−6 degrees of beam steering. The resonance cavity allows for the small refractive index change to provide beam steering. Capacitance depends on the electro-optic modulator design, where about an 8 micron diameter with an insulating air gap slot of 0.35 microns is provided. The resistance was about 16 ohms. Also, the delay was the RC of 50 femtoseconds without parasitics. Back reflection is relatively constant independent of which cavity emits light. The VCSEL having a two-cavity electro-optic modulator only needs a small change in index of refraction to achieve adequate beam steering. The VCSEL having a two-cavity electro-optic modulator can have a small beam diameter, which is preferably single mode. The VCSEL having a two-cavity electro-optic modulator can have single polarization, which the structure enforces. The VCSEL having a two-cavity electro-optic modulator can include an insulating divider between the two cavities so that independent biases may be applied between the two different cavities.

In one embodiment, there can be +/−0.3% matching between FP (Fabrey Perot) resonance of the different cavities (e.g., between the two cavities on two cavity designs).

In one embodiment, standard electro-optical (EO) materials and organic EO materials that have too small a coefficient may be excluded from the electro-optic modulator VCSEL. Also, EO materials that require too much voltage for the index change can be excluded. For example lithium niobate may be excluded.

In one embodiment, the electro-optic modulator of the electro-optic modulator VCSEL is a reverse bias modulator. In part, this is because forward biased modulators have variable absorption, and suffer from transit time delay issues. The electro-optic modulator of the invention that is a reverse bias modulator overcomes problems associated with forward biased modulators.

In one embodiment, the electro-optically active region can include one or more layers of or one or more depleted quantum well configured in reverse bias so that the absorption edge is slightly shorter wavelength than the lasing wavelength and absorption coefficient in the electro-optic material is less than 2000/cm. This gives adequate index change without an excessive absorption effect. The electro-optically active region can include suitably modified quantum wells with a change in refractive index of 0.02, which can have low absorption allowing reasonable temperature stability with good beam steering. However, the refractive index change of the EO material can be 0.05, which can be closer to the absorption edge as would occur at higher temperatures without significant absorption. On the other hand, refractive index changes over 0.05 may result in significant absorption and result in back reflection changes, and thereby the index change can be less than 0.05.

In one embodiment, the electro-optically active region can include graphene, which has a large index change so it may be useful also as the electro-optic material. For additional information, U.S. Applications 61/923,428 filed Jan. 3, 2014 and Ser. No. 14/589,392 filed Jan. 5, 2015 are each incorporated herein by specific reference in its entirety.

In one embodiment, an electro-optic modulator VCSEL with two cavities can be used for a fundamental mode for mode conversion from a fundamental to first angular mode by alternating opposite bias applied to the electro-optic two modulator cavities. Also, higher order conversion can be obtained with more electro-optic modulator cavities. Also, four electro-optic modulator cavities (e.g., electro-optic modulator quadrants) allow a second angular mode. Additional angular modes can be obtained for 6, 8, 10, etc. electro-optic modulator cavities.

Figure 2F:
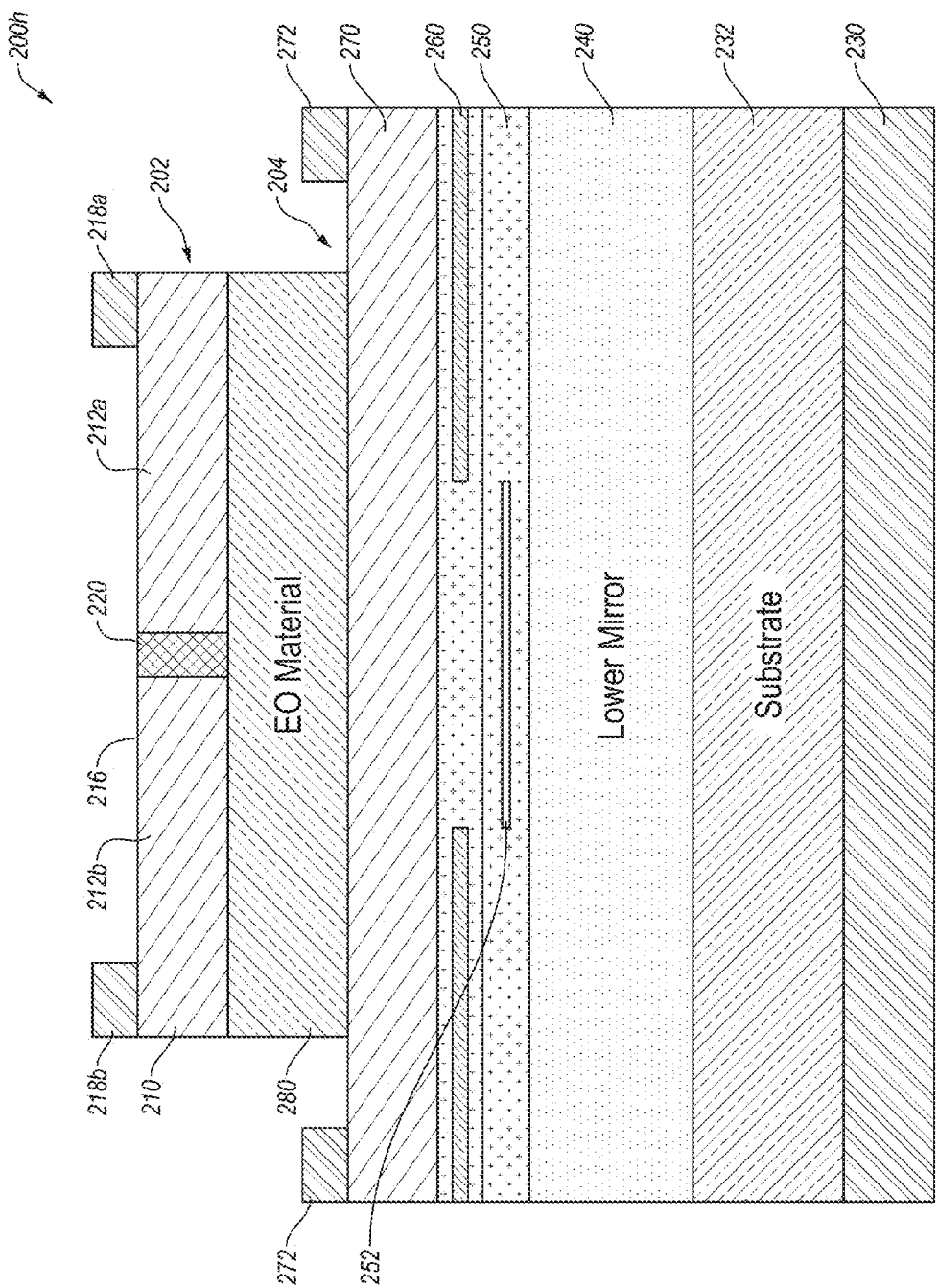
FIG. 2F shows a general structure of a multi-cavity VCSEL having a mesa.
Figure 2G:
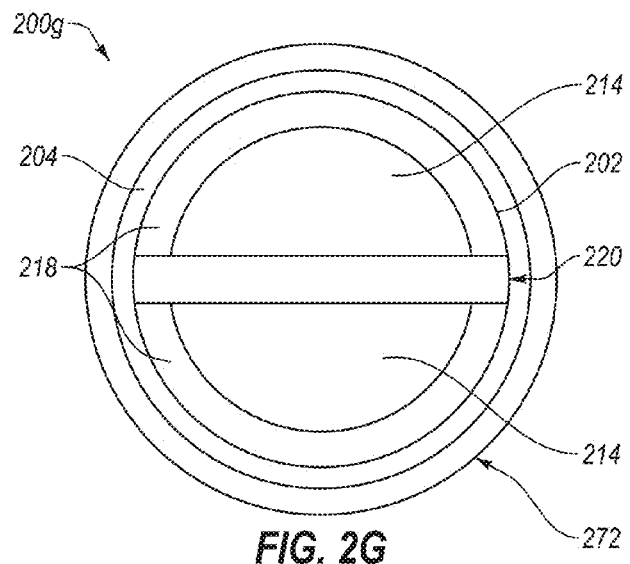
FIG. 2G shows a top view of a circular multi-cavity VCSEL having a mesa with two electro-optic modulator cavities separated by an insulator.
Figure 2H:
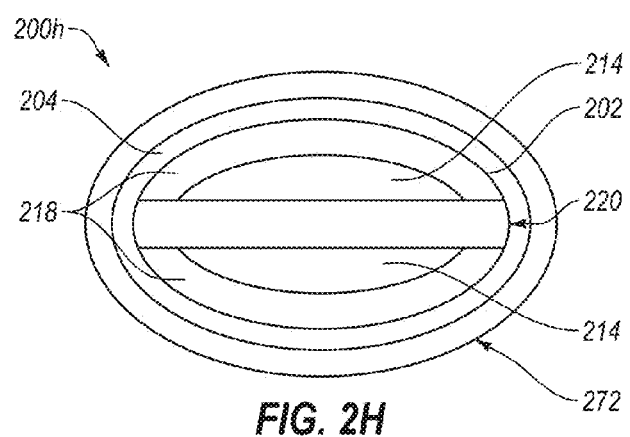
FIG. 2H shows a top view of a multi-cavity VCSEL having an oval mesa with two electro-optic modulator cavities separated by an insulator.
Figure 2I:
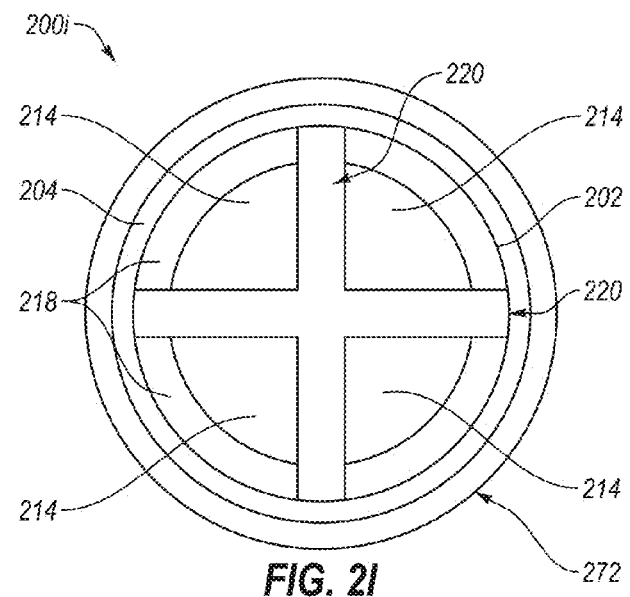
FIG. 2I shows a top view of a multi-cavity VCSEL having a circular mesa with four electro-optic modulator cavities separated by two orthogonal insulators or a plus shaped insulator to make a quadrant configuration.

FIG. 2F shows a general structure of a multi-cavity VCSEL 200h having a mesa 202. Here, the modulator contacts 218a, 218b are on the mesa 202 and the upper lasing contact 272 is on the shoulder 204. From bottom to top, the multi-cavity electro-optic modulator VCSEL 200h is shown to have: a bottom lasing electrode 230; substrate 232 on the bottom electrode 230; bottom mirror region 240 (e.g., lower mirror) on the substrate 232; a lasing active region 250 having a quantum well region 252 on the bottom mirror region 240; an annular oxide member 260 forming an oxide aperture (e.g., for optical and electric confinement, formed by annular oxide) over the lasing active region 250, and a middle mirror region 270 over the oxide aperture 260; the foregoing being under the shoulder 204 (e.g., bottom region having the shoulder 204). The VCSEL 200h can include a mesa 202 having: an electro-optically active region 280 over the middle mirror region 270, a top mirror region 210 over the electro-optically active region 280; an insulator 220 located in the top mirror region 210 to form two or more distinct mirror cavities 212a, 212b (e.g., electro-optic modulator cavities); a top surface 216 over the top mirror region 210 and insulator 220; and a modulator electrode 218a, 218b for each mirror cavity 212a, 212b on the top surface 216 and electrically coupled with the mirror cavities 212a, 212b. As show, there is one insulator 220 forming two mirror cavities 212a, 212b, and two modulator electrodes 218a, 218b, with one electrode for each mirror cavity. However, it is apparent that any number of cavities and electrodes can be included. The middle mirror region 270 also is electrically coupled to a top lasing electrode 272 (e.g., annular, C-shaped, etc.), which is on the shoulder 204.

FIG. 2G shows a top view of a multi-cavity VCSEL 200g having a mesa 202 with two electro-optic modulator cavities 214 separated by an insulator 220. As shown, each electro-optic modulator cavity 214 includes a modulator electrode 218. Also, the insulator 220 separates the modulator electrodes 218. Here, the two electro-optic modulator cavities 214, insulator 220, and modulator electrodes 218 are on the mesa 202, and the lasing electrode 272 is on the shoulder 204. Here, the mesa 202 and shoulder 204 are circular. The two electro-optic modulator cavities 214 alternate emitting light so as to steer the emitted light beam, and thereby control conversion from the fundamental mode to first angular mode.

FIG. 2H shows a top view of a multi-cavity VCSEL 200h having an oval mesa 202 with two electro-optic modulator cavities 214 separated by an insulator 220. As shown, each electro-optic modulator cavity 214 includes a modulator electrode 218. Also, the insulator 220 separates the modulator electrodes 218. Here, the two electro-optic modulator cavities 214, insulator 220, and modulator electrodes 218 are on the mesa 202, and the lasing electrode 272 is on the shoulder 204. Here, the mesa 202 and shoulder 204 are oval. The two electro-optic modulator cavities 214 alternate emitting light so as to steer the emitted light beam, and thereby control conversion from the fundamental mode to first angular mode.

FIG. 2I shows a top view of a multi-cavity VCSEL 200i having a mesa 202 with four electro-optic modulator cavities 214 separated by two insulators 220 to make a quadrant configuration. However, a single plus shaped (e.g., "+") insulator 220 can be used. As shown, each electro-optic modulator cavity 214 includes a modulator electrode 218. Also, the insulators 220 separate the modulator electrodes 218. Here, the four electro-optic modulator cavities 214, insulator 220, and modulator electrodes 218 are on the mesa 202, and the lasing electrode 272 is on the shoulder 204. Here, the mesa 202 and shoulder 204 are circular. The four electro-optic modulator cavities 214 alternate bias and thus alternate the emitting phase so as to transform the emitted light beam, and thereby control conversion from the fundamental mode to the second angular mode. If the order of bias is changed so that an adjacent cavity on one side has a like bias, while on the other has the complimentary bias, then a fundamental mode is transformed to the first angular mode.

In one embodiment having the four electro-optic modulator cavities, there can be a mode conversion from the fundamental to the second angular mode when the two cavities common to the diagonals have different applied bias than the cavities on the other diagonal, and which can be switched between the two different diagonal cavities causing switching between the fundamental and the second angular mode. This can be done with or without a half-wave delay (see FIG. 3A). This can be applied to more than four electro-optic modulator cavities.

During operation of the VCSELS, light is nominally emitted from all of the electro-optic modulator cavities at the same time; however, the change in refractive index causes a relative phase shift and can provide beam steering.

In one embodiment, the electro-optic modulator cavities are numbered in sequence, and a first bias is applied to odd numbered cavities and a second bias opposite of the first bias is applied to the even numbered cavities. This provides a phase change between the even and odd cavities. The application of the first and second bias can be modulated to modulate data onto the emitted light in the form of angular momentum or mode order modulation. Combined with spatial or numerical aperture filters this can be converted to amplitude modulation.

Figure 3A:
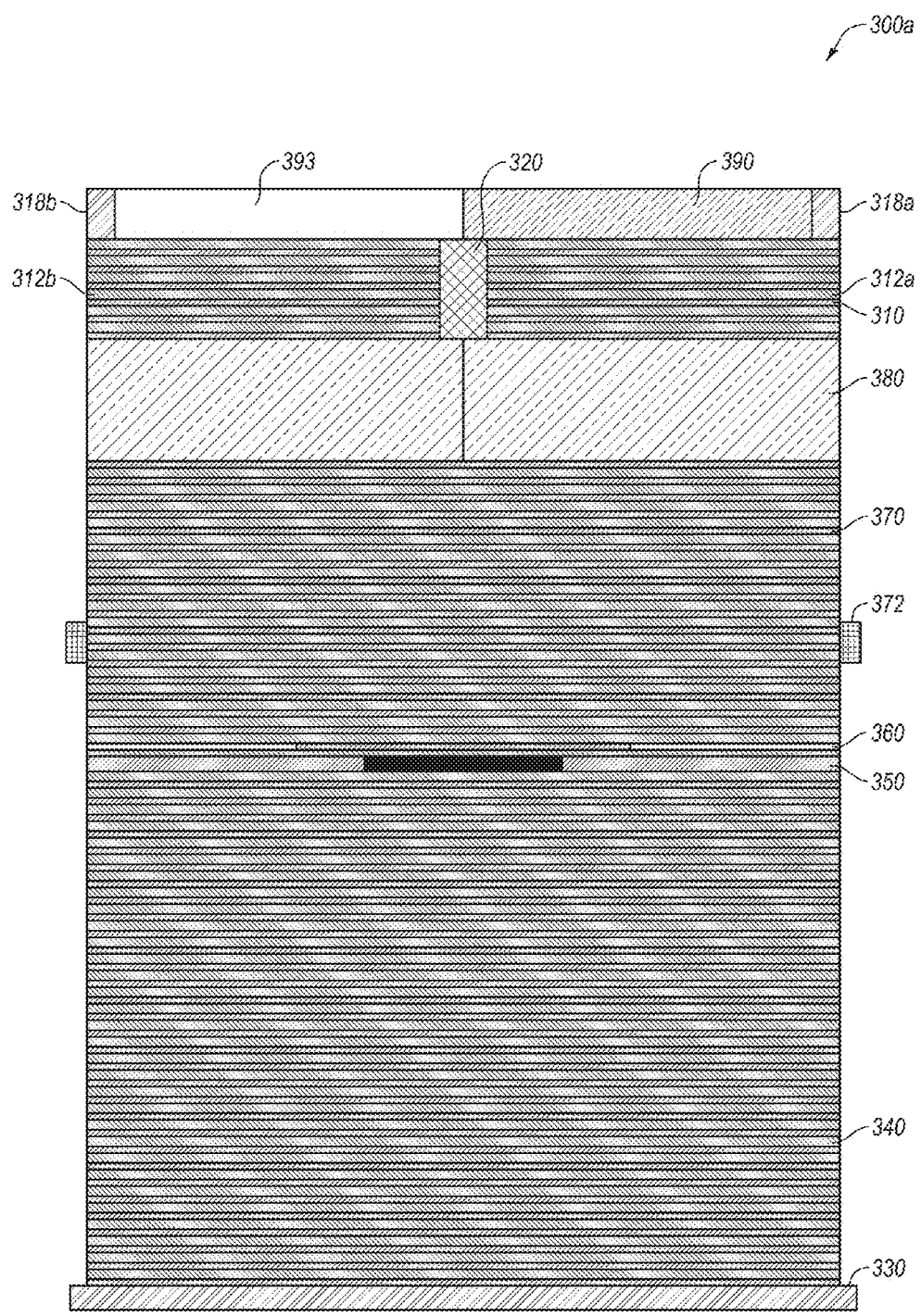
FIG. 3A illustrates a general embodiment of a multi-cavity electro-optic modulator VCSEL that is configured with built-in phase shifts.

FIG. 3A shows another embodiment of a multi-cavity electro-optic modulator VCSEL 300a that is configured with built-in phase shifts. Alternatively, the VCSEL 300a can be configured with mesa and shoulder regions. From bottom to top, the multi-cavity electro-optic modulator VCSEL 300a is shown to have: a bottom lasing electrode 330; bottom mirror region 340 on the bottom lasing electrode 330; a lasing active region 350 on the bottom mirror region 340; an annular oxide member 360 forming an oxide aperture over the lasing active region 350, a middle mirror region 370 over the oxide aperture 360, an electro-optically active region 380 over the middle mirror region 370, a top mirror region 310 over the electro-optically active region 380; an insulator 320 located in the top mirror region 310 to form two or more distinct mirror cavities 312a, 312b (e.g., electro-optic modulator cavities); a half-wave plate 390 over one of the distinct mirror cavities 312a, and an air gap region 393 over the other distinct mirror cavity 312b. Also, the VCSEL 300a includes a modulator electrode 318a, 318b for each mirror cavity 312a, 312b that is electrically coupled therewith. Also, a top lasing electrode 372 is electrically coupled with the middle mirror region 370, and a bottom lasing electrode 330 is electrically coupled with the bottom mirror 340, where the top and bottom lasing electrodes 372, 330 cooperate to drive lasing from the active region 350. As shown, there is one insulator 320 forming two mirror cavities 312a, 312b, and two electrodes 318a, 318b, with one electrode for each mirror cavity. However, it is apparent from the disclosure provided herein that any number of mirror cavities and electrodes can be included. Also, the VCSEL 300 can include any components, layers, regions, or configurations from any of the other VCSELs described herein.

In one embodiment, the half-wave plate 390 of any of the VCSELS can be changed to any other delay device. As such, the half-wave plate 390 can be a delay plate that delays the light. Some examples can be ¼, and ½ wave delays or any factor of ¼ or ½ wave delay, but can also be any other delay desired.

The air gap region 393 may optionally have a thinner region above the half-wave plate 390, and a thicker region over the mirror cavity 312b. The air gap region 393 can be a single material or space, or be divided into multiple regions or spaces. While it is referred to as an air gap region 393, it may be any type of gap or insulating material, where gases, such as air, oxygen, nitrogen or the like are preferred. However, the air gap region 393 may only be the thicker region over the mirror cavity 312b or another material may be included so that there is no air.

In one embodiment, the air gap region 393 can be considered to be an optically transmissive region 393 such that when adjacent to the half-wave plate 390 there can be a surface that is continuous for mating with a flat optical fiber.

Also, when there are an even number of mirror cavities, a half-wave plate 390 can be included over half of the mirror cavities. This can include a single half-wave plate 390 being on all the mirror cavities on one side of the VCSEL 300a, or a half-wave plate 390 for each mirror cavity, which can be in any arrangement, such as being over alternating mirror cavities or over the mirror cavities on one side of the VCSEL 300a. The half-wave plate 390 can be used to provide a half-wave delay in the emitted light compared to the light emitted through the air gap region 393. The half-wave plate 390 can be silicon nitride; however, other half-wave plate materials can be used. The half-wave plate 390 can provide a phase shift. Also, the half-wave plate 390 can be multiple plates thereof so that the phase shift can be shifted by any amount. The half-wave plate 390 can create an angular offset in the light emitted therethrough compared to light not emitted through a half-wave plate 390. Thus, each half-wave plate 390 can provide a half-wave delay for light emitted therethrough compared to light that is not emitted through a half-wave plate 390. In one aspect, the half-wave plate 390 can be any material that imparts a half wave delay in the emitted light relative to the other side.

In the VCSEL with the half-wave plate 390, the light from the lasing active region 350 is a fundamental mode, where the half-wave plate 390 in one cavity and one cavity not having the half wave plate in combination can be a mode converter, and converts the mode for light passing out of the cavity 312, by delaying the light from 312a relative to 312b thus converting the fundamental into the first angular mode.

In one option shown in FIG. 3A, the modulator electrodes 318a, and 318b are placed onto the top surface of the top mirror region 310. This can include the electrode 318a being in a hole in the half-wave plate 390 so as to contact the top mirror region 310.

Figure 3B:
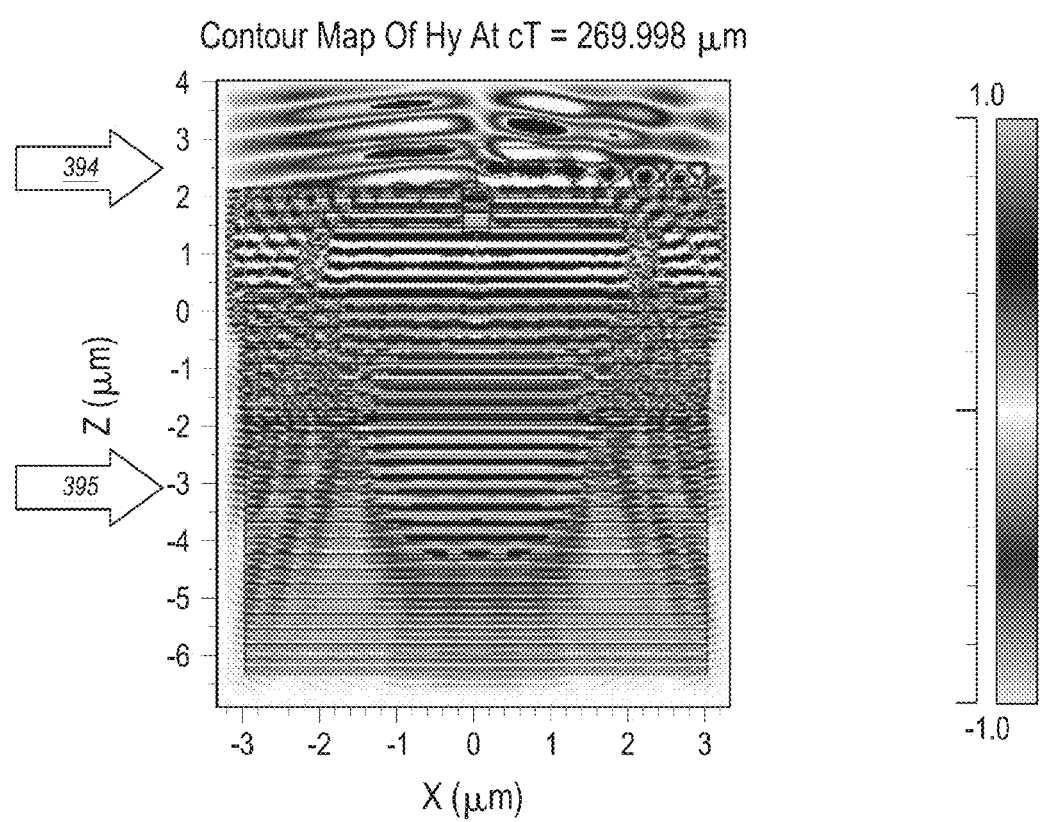
FIG. 3B includes a contour map obtained by 2D simulation results of the VCSEL of FIG. 3A without biasing the electro-optic modulator.

FIG. 3B illustrates a contour map obtained by 2D simulation results of the VCSEL 300a of FIG. 3A without biasing the electro-optic modulator. The 2D simulation shows beam steering with an air insulator in the electro-optic modulator and the silicon nitride half-wave plate. The top arrow 394 shows that the mode is transformed to a $1^{st}$ angular mode that is asymmetric, while the bottom arrow 395 shows that the lasing active region provides a symmetric and fundamental mode. Thus, the half-wave plate can change the angular mode of the light emitted therethrough. This can also provide beam steering as described herein. The contour map shows that the light emitted from one side is 180 degrees out of phase for the light emitted from the other side, which can be shown by the black and white contours being 180 degrees out of phase, or where at an equal distance one side is black and the other side is white. The contour map shows slight beam steering.

Figure 3C:
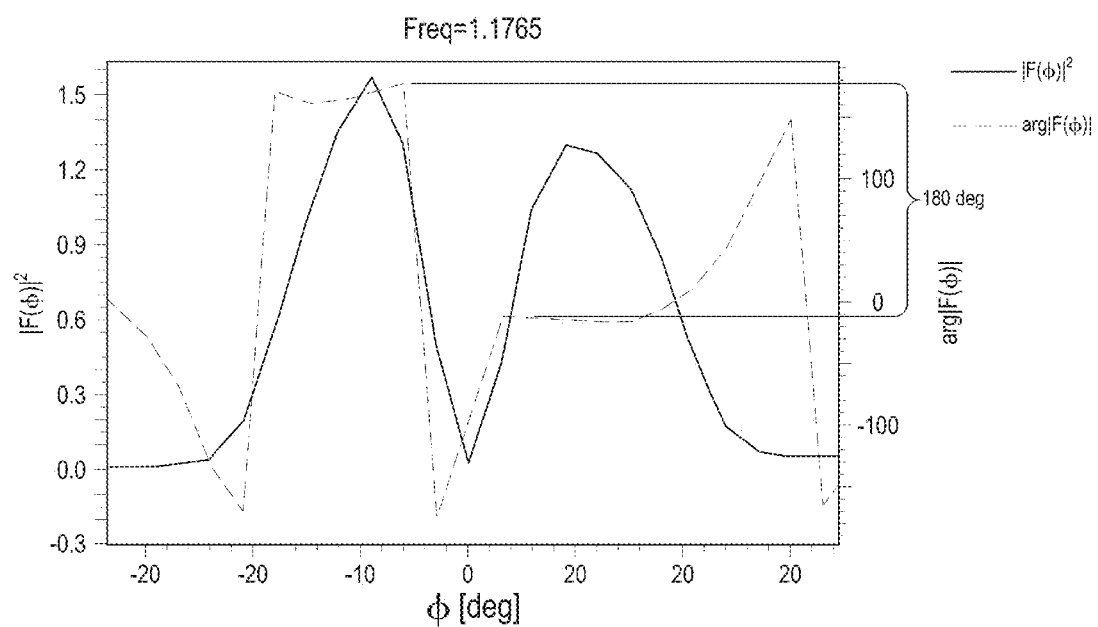
FIG. 3C includes a graph of the far field data that shows a 180 degree phase shift across the center without any bias to the electro-optic modulator, which indicates that there is a mode conversion from the half-wave plate.

FIG. 3C includes a graph of the far field data that shows a 180 degree phase shift across the center without any bias to the electro-optic modulator, which implies that there is a mode conversion from the half-wave plate. Also, a double hump is shown. The bottom line is a 180 degree shift in phase going across the center of the device and that is what is observed in FIG. 3B where it changes in the contour map of FIG. 3B. The curve appears as a shape of a double hump or dumbbell, which indicates power on the two sides.

Figure 3D:
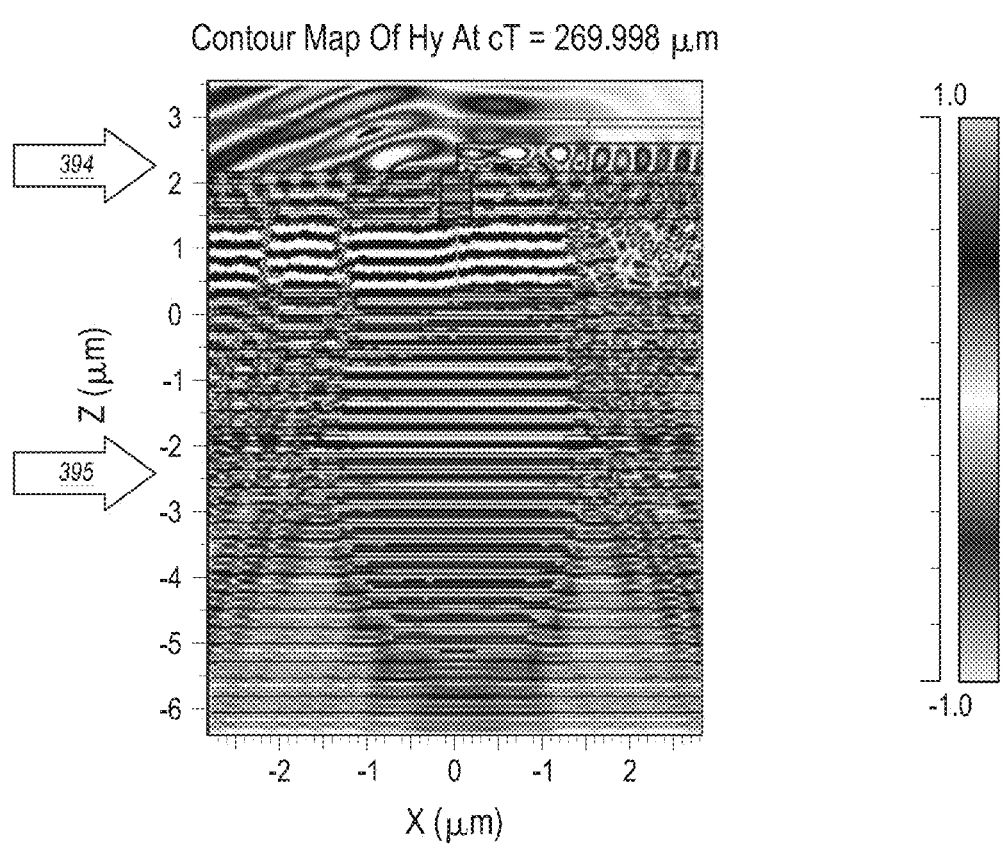
FIG. 3D includes a contour map for the VCSEL of FIG. 3A with an applied field.
Figure 3E:
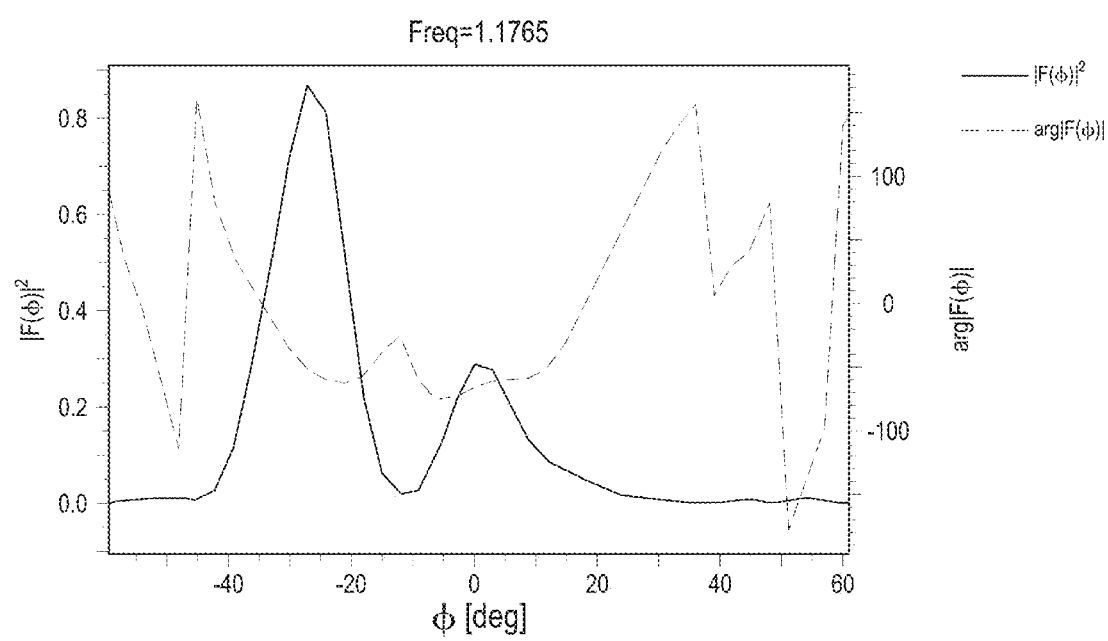
FIG. 3E includes a graph of the far field data with the applied field.

When there is an applied bias, it changes the relative amount of delay on the right side and the left side, which is shown by the phase. Going across, it is constant across the hump regions of the dumbbell shape. There is a lot of angle on the big lobe on the left side, at 20 degrees, which indicates the VCSEL with the half-wave plate can be used for beam steering also. FIGS. 3D and 3E show when there is an applied bias to the different electro-optic modulator cavities for beam steering. This changes the amount of mode conversion. For example, the double hump or dumbbell of FIG. 3C is lessened in FIG. 3E, where it is mostly on one side.

FIG. 3D includes a contour map for the VCSEL 300a of FIG. 3A with an applied field. Here, the applied field is compensating for the built in half-wave delay, where there is a delta n+=/−0.055 (e.g., change in refractive index), which is very large. As such, significant beam steering is obtained compared to FIG. 3B without the applied field. The angular mode is much more asymmetric (arrow 394) for the emitted light while the lasing active region retains the symmetry (arrow 395). The contour map shows significantly increased beam steering with the applied field to the electro-optic modulator and the half-wave plate. There is also mode conversion, and thereby the VCSEL can be operated by modulating the laser with beam steering and/or by changing mode shape. Also, modulation can be implemented by changing polarization.

FIG. 3E shows the graph of the far field data with the applied field. It is noted that with about 0 phase across the fair field it is nearing the profile of being fundamental, but still way off center.

Also, it should be recognized that the data for FIGS. 3B-3E includes only two adjacent electro-optic modulator cavities. If there are more individual cavities, the light output can change. For example, if there are four adjacent electro-optic modulator cavities, the two lobes of FIGS. 3C and 3E can go to four lobes. That is, the fundamental mode can go to four lobes. With four adjacent electro-optic modulator cavities, the diagonal cavities can include the half-wave plate.

Figure 4A:
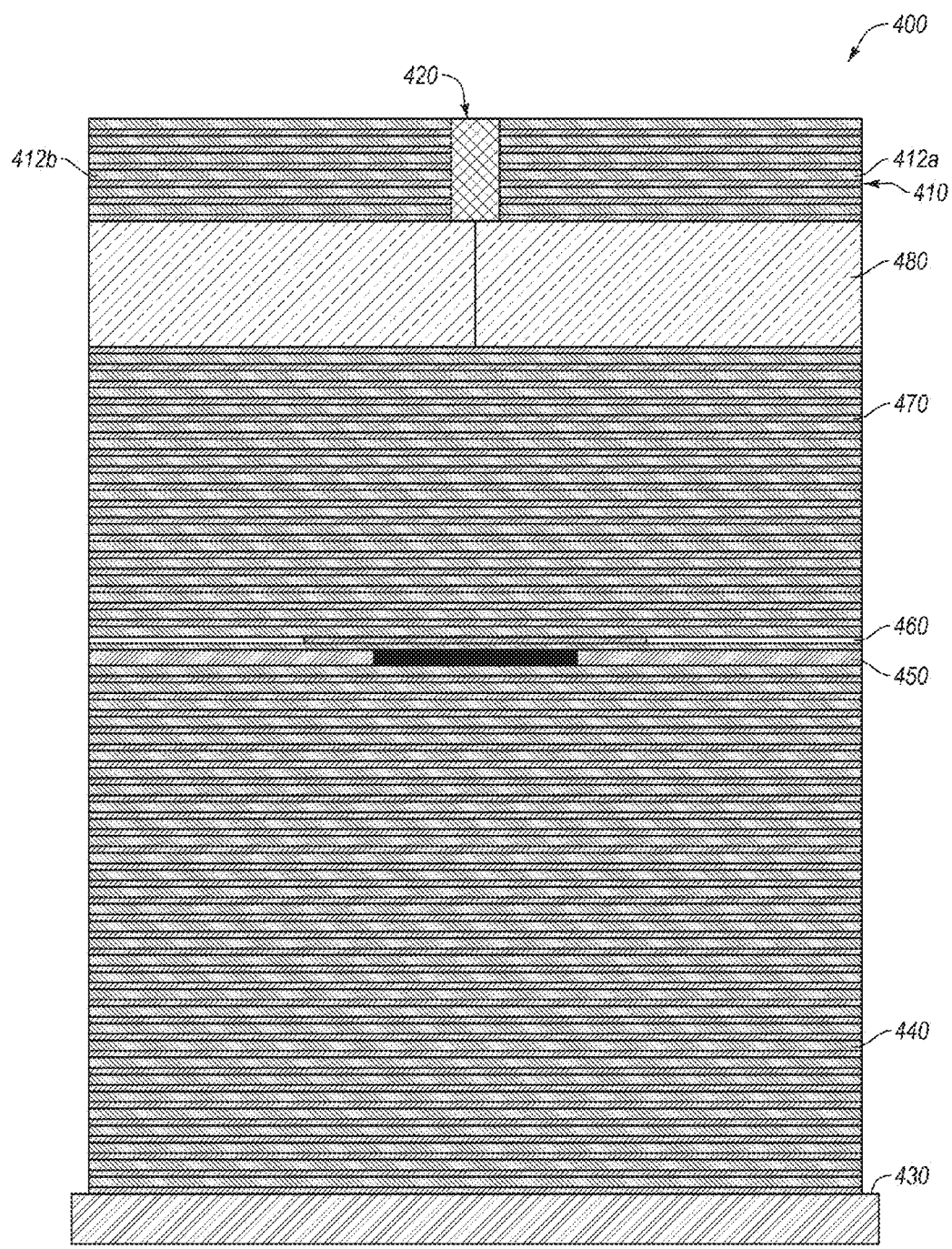
FIG. 4A shows an embodiment of a VCSEL that includes a damage implant region, such as a proton or helium to create an insulating region.

FIG. 4A shows a VCSEL 400 that uses a damage implant region 420, such as a proton or helium to create an insulating region. That is, the damage implant region 420 functions as the insulator without there being an insulator material located within the top minor region 410; however, it should be recognized that the damage implant region 420 indeed is an insulator and materially different from the adjacent mirror cavities 412a, 412b by having the implant. From bottom to top, the multi-cavity electro-optic modulator VCSEL 400 is shown to have: a bottom lasing electrode 430; bottom mirror region 440 on the bottom lasing electrode 430; a lasing active region 450 on the bottom mirror region 440; an oxide aperture 460 over the lasing active region 450, a middle mirror region 470 over the oxide aperture 460, an electro-optically active region 480 over the middle mirror region 470, a top mirror region 410 over the electro-optically active region 480; and an damage implant region 420 located in the top mirror region 410 to form two or more distinct mirror cavities 412a, 412b (e.g., electro-optic modulator cavities). Also, the VCSEL 400 includes a modulator electrode (not shown) for each mirror cavity 412a, 412b that is electrically coupled therewith. Also, a top lasing electrode (not shown) is electrically coupled with the middle mirror region 470, and a bottom lasing electrode 430 is electrically coupled with the bottom mirror 440, where the top and bottom lasing electrodes cooperate to drive lasing from the active region 450. However, it is apparent from the disclosure provided herein that any number of mirror cavities and electrodes can be included. Also, the VCSEL 400 can include any components, layers, regions, or configurations from any of the other VCSELs described herein.

The damage implant region 420 can be a mirror region that is bombarded by implantation, which can be proton implantation, helium implantation, or other implantation that increases the insulation of the region 420 or decreases the electrical conductance of the region 420. Any damage implant process can be used. The implanted material can create traps to make it insulating.

Figure 4B:
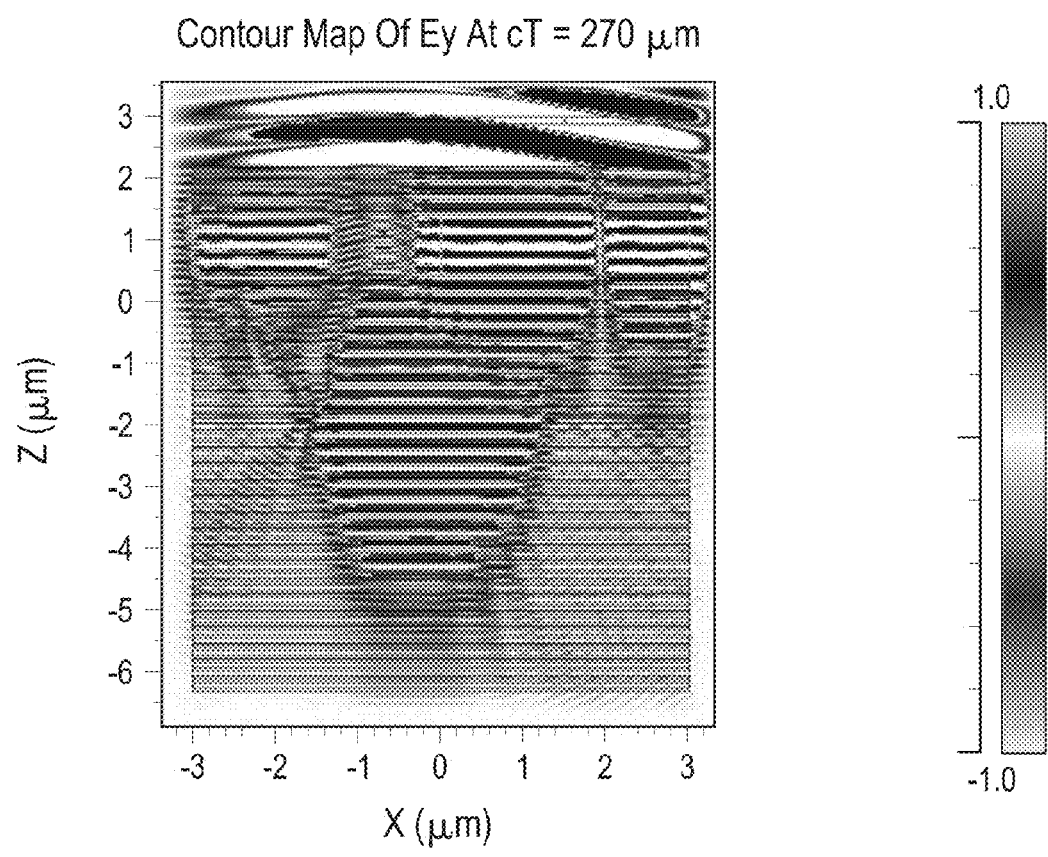
FIG. 4B includes an electric field contour map for the VCSEL of FIG. 4A.

FIG. 4B is the electric field contour map for the VCSEL 400 of FIG. 4A. This shows that the damage implant region 420 as an insulator has a refractive index change of 0.01 and has a 7.5 degree steering, where the electric field is coming out of the graph (Y-axis is out of paper and light is emitted on the Z axis). The Ey designates the electric field is coming out of the paper, as with all contour graphs with the Ey designation.

Here, the electro-optically active region of the electro-optic modulator has a change in the refractive index of 0.01. For example, with the material being gallium arsenide, the index changes from 3.6 to 3.61 and to 3.59. The resonant cavity of the VCSEL allows such a small change in refractive index to be useful for beam steering. The VCSEL 400 with the damage implant region 420 as the insulator results in 7.5 degree beam steering when the electric field is out of the page and 8 degree beam steering when the magnetic field is out of the page (see FIG. 4D).

Figure 4C:
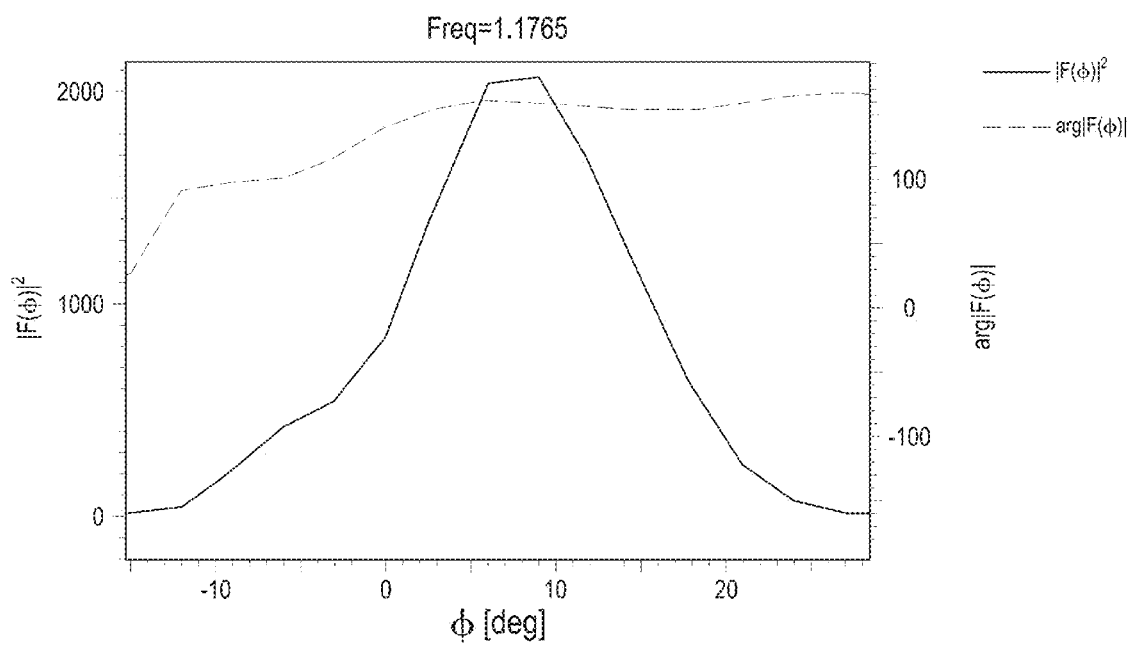
FIG. 4C includes a graph showing the far field data for the VCSEL of FIG. 4A.

FIG. 4C is a graph showing the far field data for the VCSEL 400 of FIG. 4A. This shows that implant as an insulator has a refractive index change of 0.01, and has a 7.5 degree steering for the electric field is coming out of the contour map of FIG. 4B.

Figure 4D:
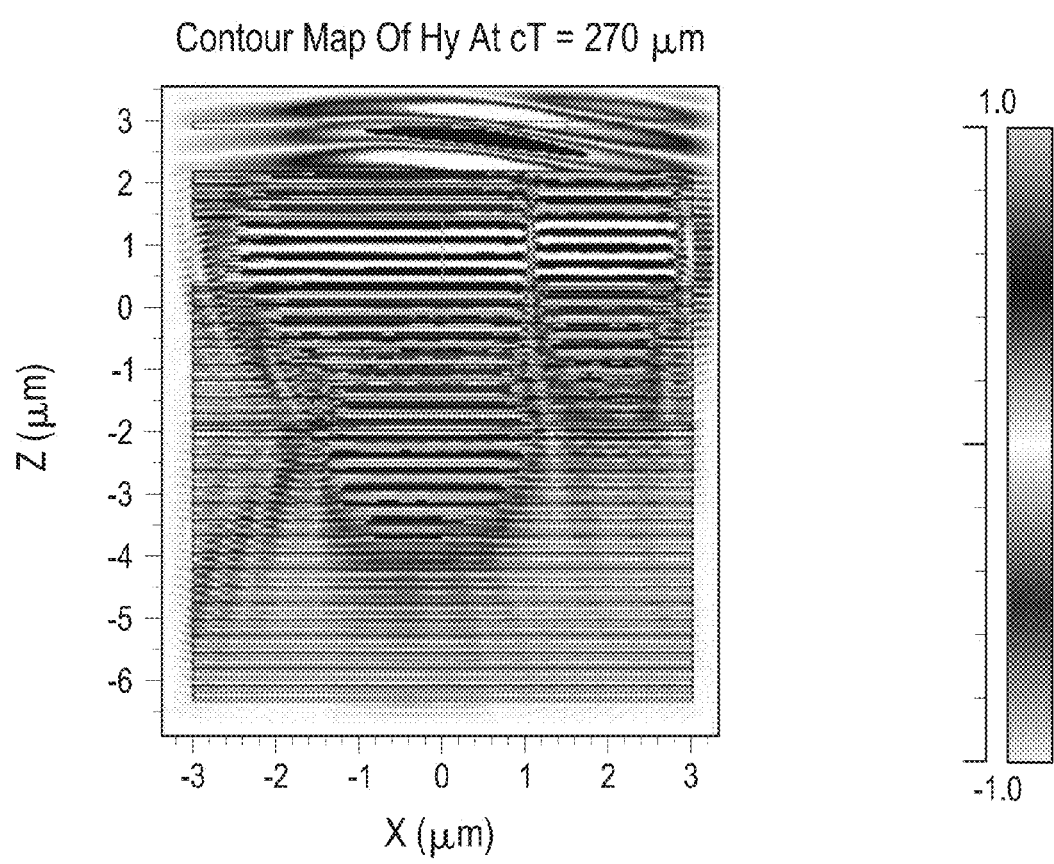
FIG. 4D includes a magnetic field contour map for the VCSEL of FIG. 4A.

FIG. 4D is the magnetic field contour map for the VCSEL 400 of FIG. 4A. This shows that implant isolated delta n+/−0.01 has an 8 degree steering, where the magnetic field is coming out of the graph (Y-axis is out of paper and light is emitted on the Z axis). The Hy designates the magnetic field is coming out of the paper, as with all contour graphs with the Hy designation.

Figure 4E:
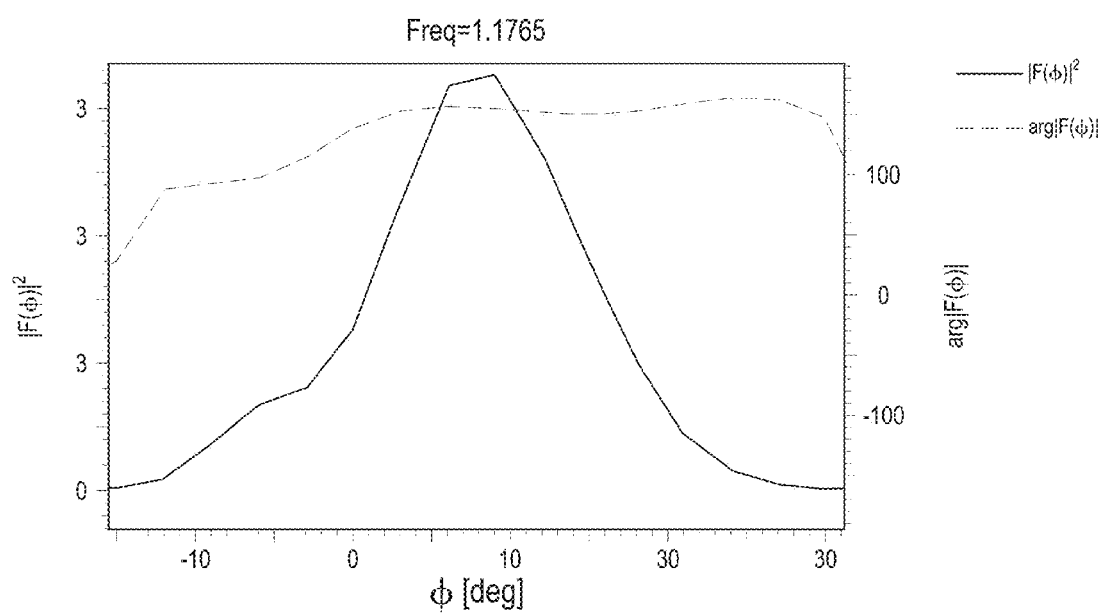
FIG. 4E includes a graph showing additional far field data for the VCSEL of FIG. 4A.

FIG. 4E is a graph showing additional far field data for the VCSEL 400 of FIG. 4A. This shows that implant isolated delta n+/−0.01 has a 8 degree steering for the magnetic field is coming out of the contour graph of FIG. 4D.

Data also showed a significant refractive index change of 0.04. The data shows that implant as an insulator has a refractive index change of 0.04, which is high, has a 12 degree steering for the electric field is coming out of the contour map. The lasing active region is still symmetric and fundamental.

Figure 5A:
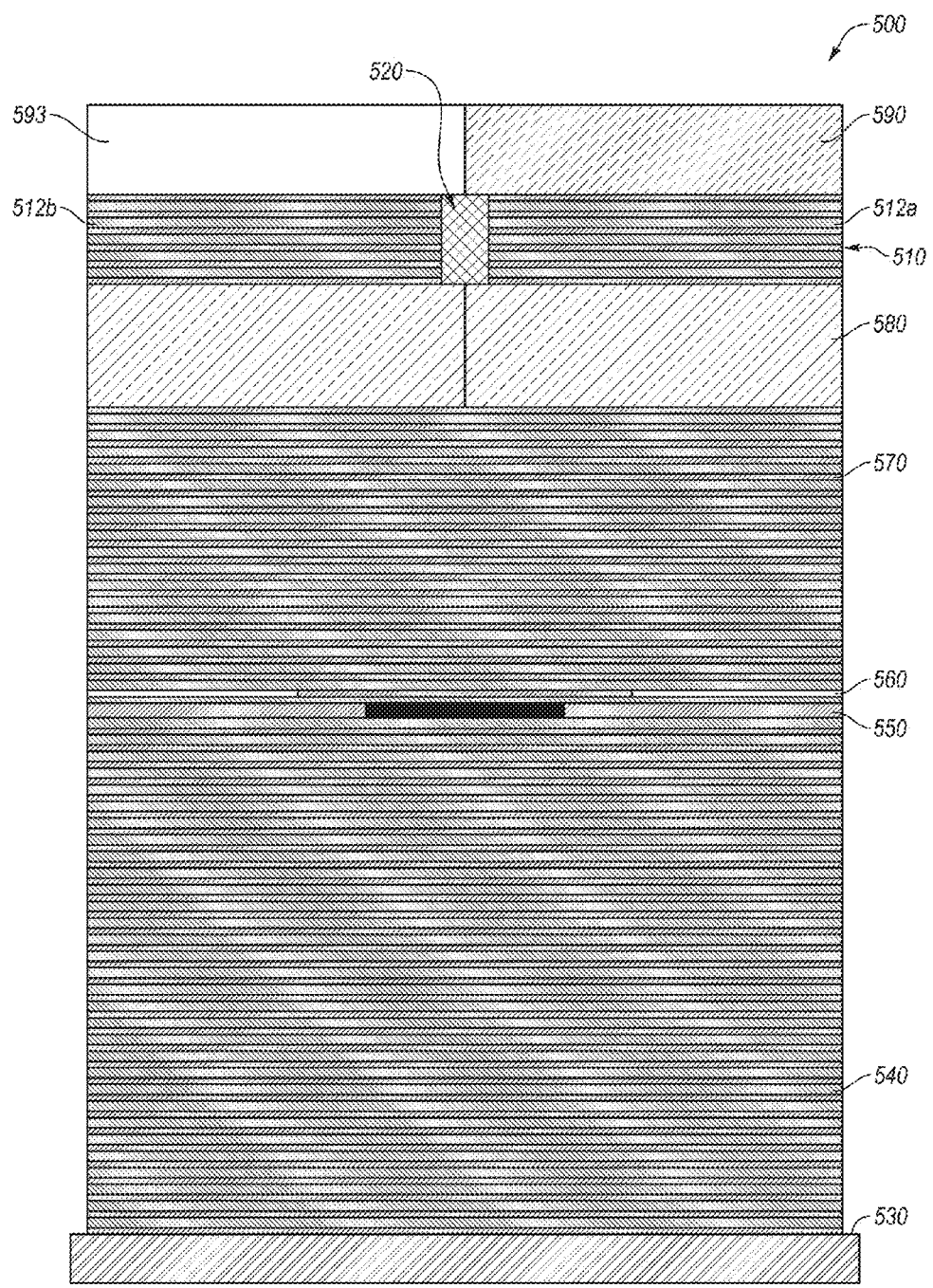
FIG. 5A shows an embodiment of a VCSEL that includes an implant isolation region and a delay wave-plate.

FIG. 5A shows a VCSEL 500 that uses an implant isolation region 520 and a half-wave delay plate 590. From bottom to top, the multi-cavity electro-optic modulator VCSEL 500 is shown to have: a bottom electrode 530; bottom mirror region 540 on the bottom electrode 530; a lasing active region 550 on the bottom mirror region 540; an annular oxide member 560 forming an oxide aperture over the lasing active region 550, a middle mirror region 570 over the oxide aperture 560, an electro-optically active region 580 over the middle mirror region 570, a top mirror region 510 over the electro-optically active region 580; an implant isolation region 520 located in the top mirror region 510 to form two or more distinct mirror cavities 512a, 512b (e.g., electro-optic modulator cavities); a half-wave plate 590 over one of the distinct mirror cavities 512a, a transmissive region 593 (e.g., air) over the other distinct mirror cavity 512b and adjacent the half-wave plate 590. The implant isolation region 520 can be any region that provides electronic isolation between the mirror cavities 512a, 512b, which can be similar to the damage implant region 420 or any other implant that achieves such electronic isolation. Also, the VCSEL 500 includes and a modulator electrode (not shown) for each mirror cavity 512a, 512b that is electrically coupled therewith. Also, a top lasing electrode (not shown) is electrically coupled with the middle mirror region 570, and a bottom lasing electrode 530 is electrically coupled with the bottom mirror region 540, where the top and bottom lasing electrodes cooperate to drive lasing from the lasing active region 550. As shown, there is one implant isolation region 520 forming two mirror cavities 512a, 512b; however, it is apparent from the disclosure provided herein that any number of mirror cavities and electrodes can be included. Also, the VCSEL 500 can include any components, layers, regions, or configurations from any of the other VCSELs described herein. The VCSEL 500 can be a combination of the VCSELS in FIGS. 3A and 4A, where the insulator 320 is swapped for the damage implant region 420 to be the implant isolation region 520 in the top mirror region 510.

Figure 5B:
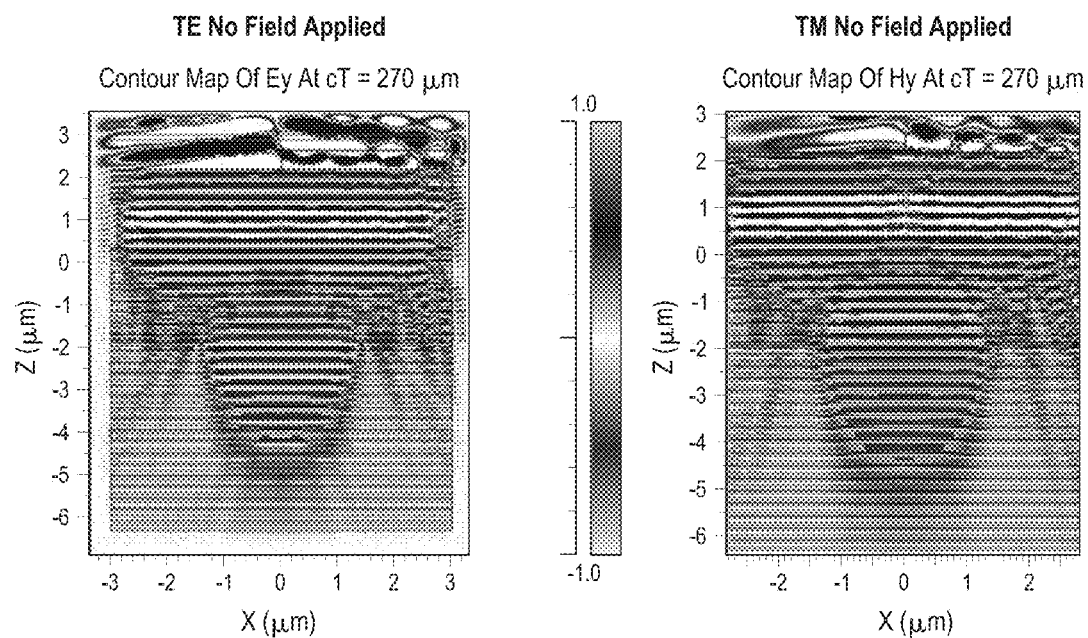
FIG. 5B includes an electric field contour map for Ey (e.g., electric field out of page) and magnetic field contour map Hy (e.g., magnetic field out of page) with no applied field.
Figure 5C:
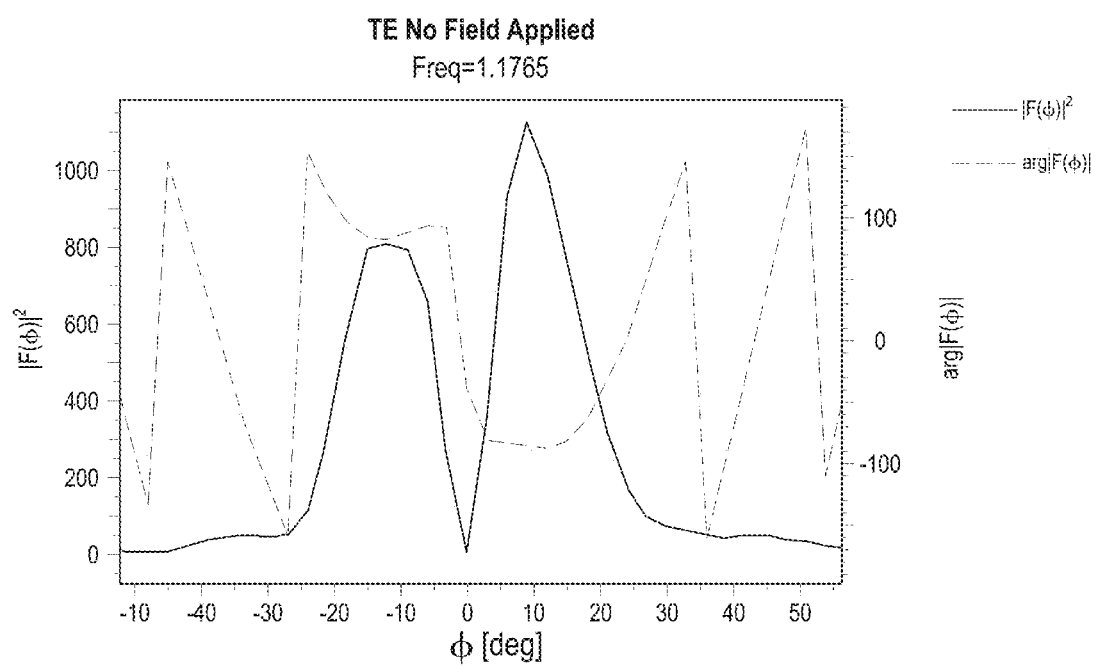
FIG. 5C includes corresponding far field graphs for the contour maps of Figure 5B with no applied field.
Figure 5D:
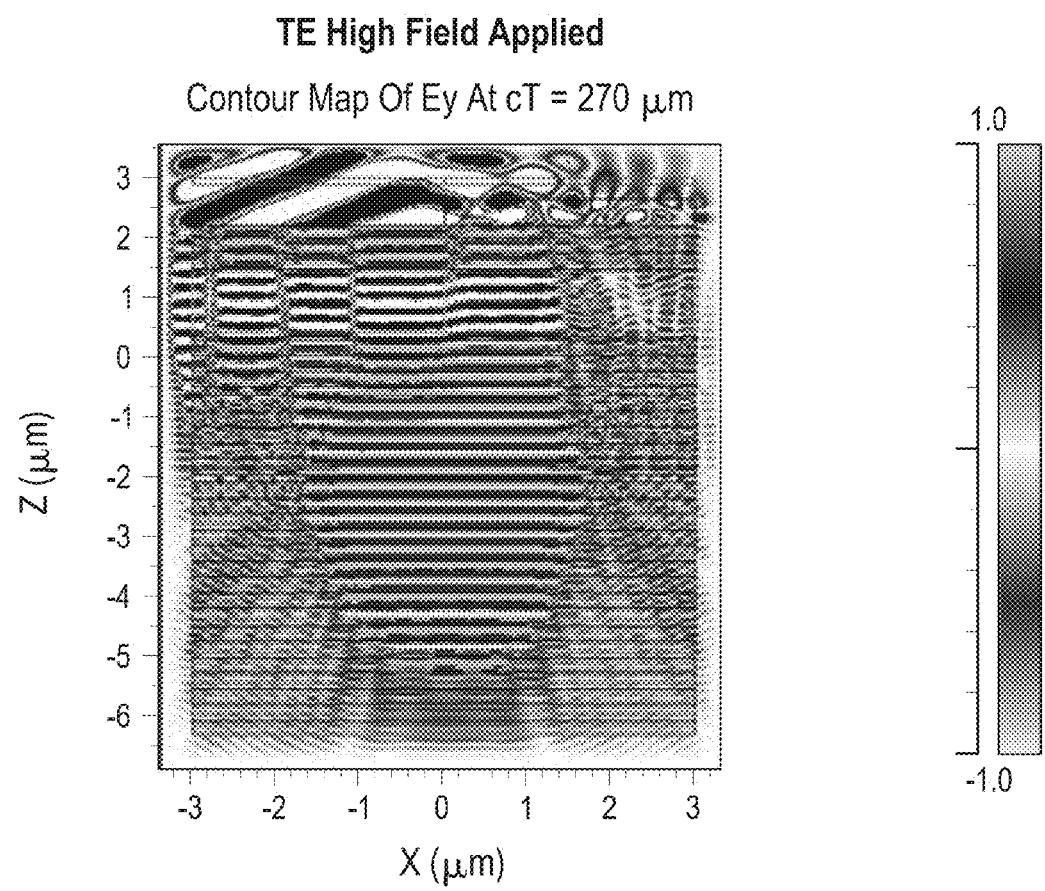
FIG. 5D includes an electric field contour map corresponding to FIG. 5B but with high applied field.
Figure 5E:
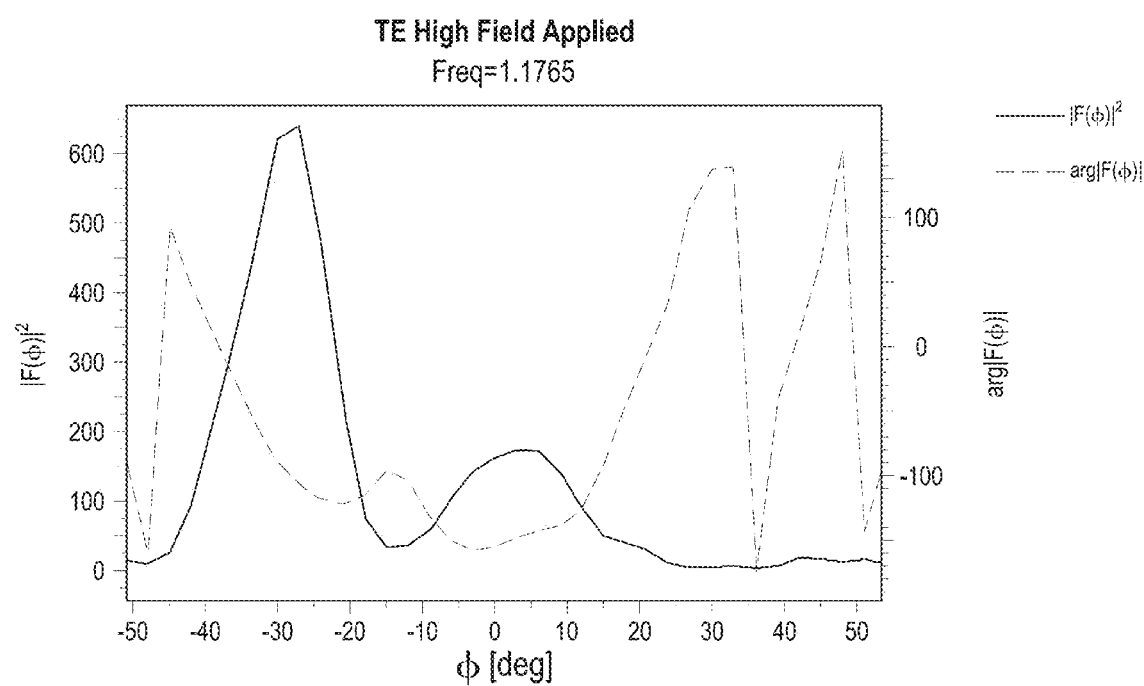
FIG. 5E includes a far field graph corresponding with FIG. 5C with high applied field.

FIG. 5B shows the electric field contour map for Ey (electric field out of page) and magnetic field contour map Hy (magnetic field out of page) with no applied field. FIG. 5C shows the corresponding far field graphs for the contour maps of FIG. 5B with no applied field. Here, it can be important to note the mode conversion in the absence of the applied field. The contour maps are similar to FIG. 3B. Also, there is phase change and double lobes (dumbbells) in FIG. 5C. This shows operation capabilities without the applied field. FIG. 5D shows the electric field contour map corresponding to FIG. 5B but with high applied field. FIG. 5E shows the far field graph corresponding with FIG. 5C with high applied field. As shown, the applied field results in more beam steering, such as a 30 degree shift. Also, the phase across is not significantly changing and mostly a single lobe with the applied field. Here, the applied field is high, where the refractive index may change 0.055.

As can be seen from the data, simulations with trenches for isolation appear to show higher reflection for the Hy polarization (magnetic field parallel to the trench) compared to the Ey polarization (electric field parallel to the trench). This may lock the laser in the Hy mode. For the implant isolated device, both polarizations in the absence of optical effects from the implant are equally likely, and the deflections can be similar. As a result, polarization hopping is not an issue. Accordingly, there may be some instances where an insulation trench (different material) is preferred, and some instances where implant isolation is preferred. Accordingly, a trench can be used when single polarization is preferred, and the implant insulation can be used when single polarization is not preferred.

Both spatial filtering and numerical aperture filtering can be used with or without passive additional optics to obtain a modulated beam coupled into a fiber with either mode conversion or beam steering or both mode conversion and beam steering.

In one embodiment, a single light guide (e.g., fiber optic) is aligned with the VCSEL so as to be aligned with all the mirror cavities.

In one aspect, the semiconductor portion of the VCSEL that is associated with the multi-cavity electro-optic modulator can be any known or developed VCSEL configuration. This allows any VCSEL of any reasonable wavelength (e.g., 850 nm to 1.5 microns) to include the multi-cavity electro-optic modulator as described herein. In one example, the VCSEL having the multi-cavity electro-optic modulator can be configured for operation at 1300 nm. Also, the multi-cavity electro-optic modulator can operate at any VCSEL operating temperature, which allows the multi-cavity electro-optic modulator to be employed in any VCSEL operating at any operating temperature.

Figure 6A:
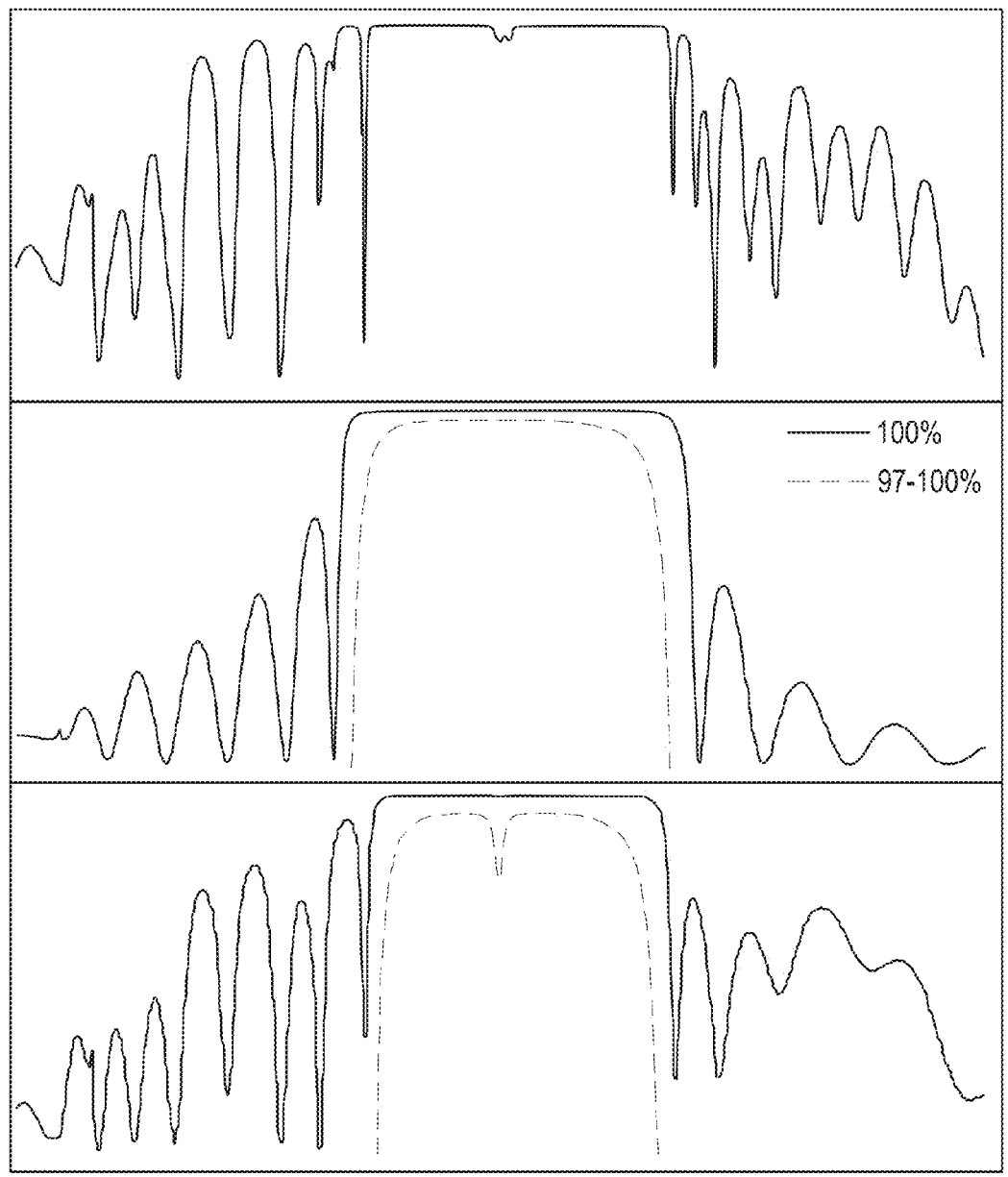
FIGS. 6A-6B include graphs that show data for use as a coupled cavity stark shift modulator.
Figure 6B:
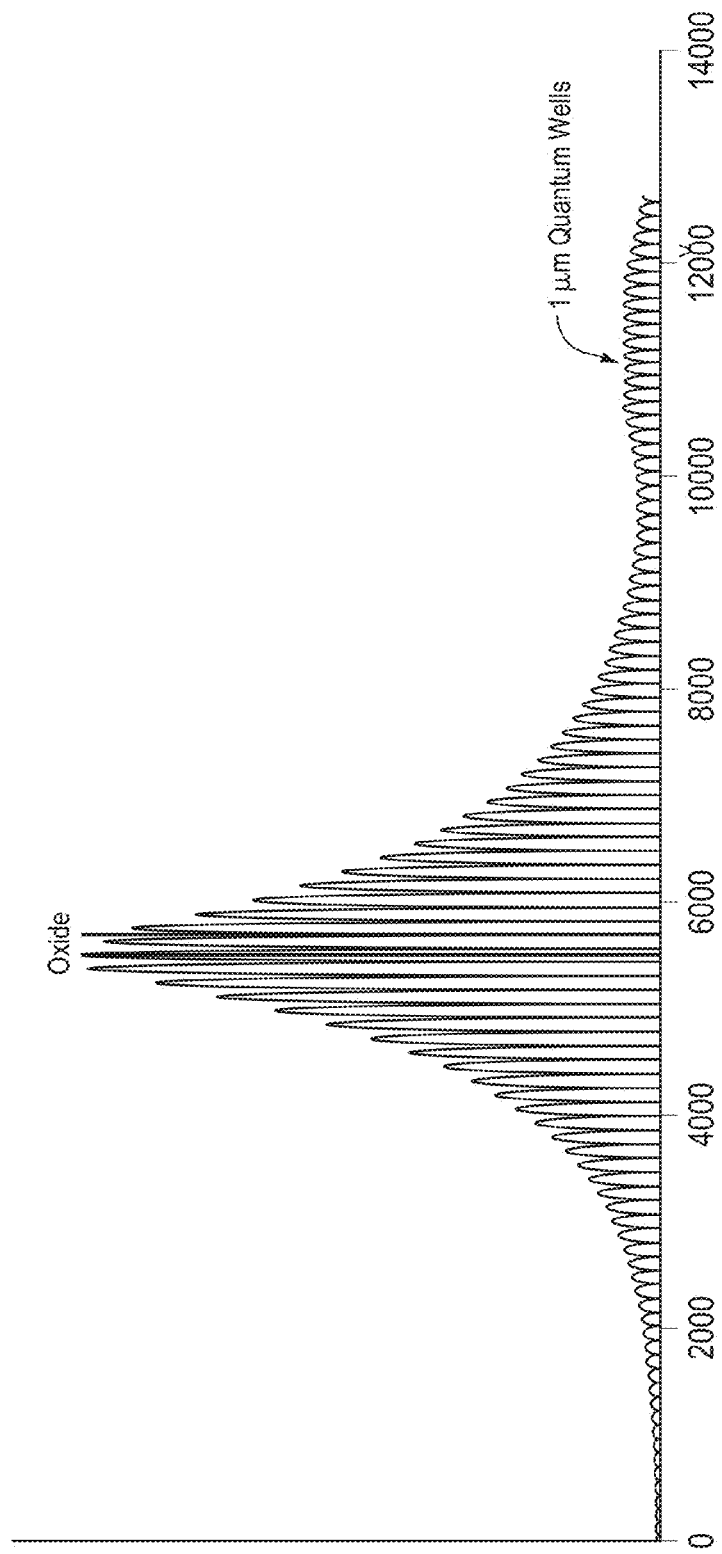

In one embodiment, the multi-cavity VCSELs described herein can be used with the multi-cavity electro-optic modulator operated as a coupled cavity stark shift modulator, in which case only one coupled electro-optic cavity is needed, but more may be used. FIG. 6A shows reflectance data for use as a coupled cavity stark shift modulator, overall reflectance from the top surface showing 2 modes, lower mirror reflectance from the quantum wells of the primary laser, and top mirror reflectance including the modulator section from the quantum wells of the primary laser. To make the beam steering work the FP mode of the primary cavity and the secondary cavity must be aligned in the unbiased state. The FP dips of the modulator cavities under bias must be nominally symmetrically opposite each other on either side of the FP dip. FIG. 6B shows the absolute value of the optical electric field vertically through the device. As shown in FIG. 6B, the location of 1 micron total thickness of quantum wells is identified. Also, optimum quantum well design can provide better performance of the multi-cavity electro-optic modulator. The multi-cavity electro-optic modulator can provide index change without absorption that is sufficient for the beam steering and/or mode conversion described herein.

Figure 6C:
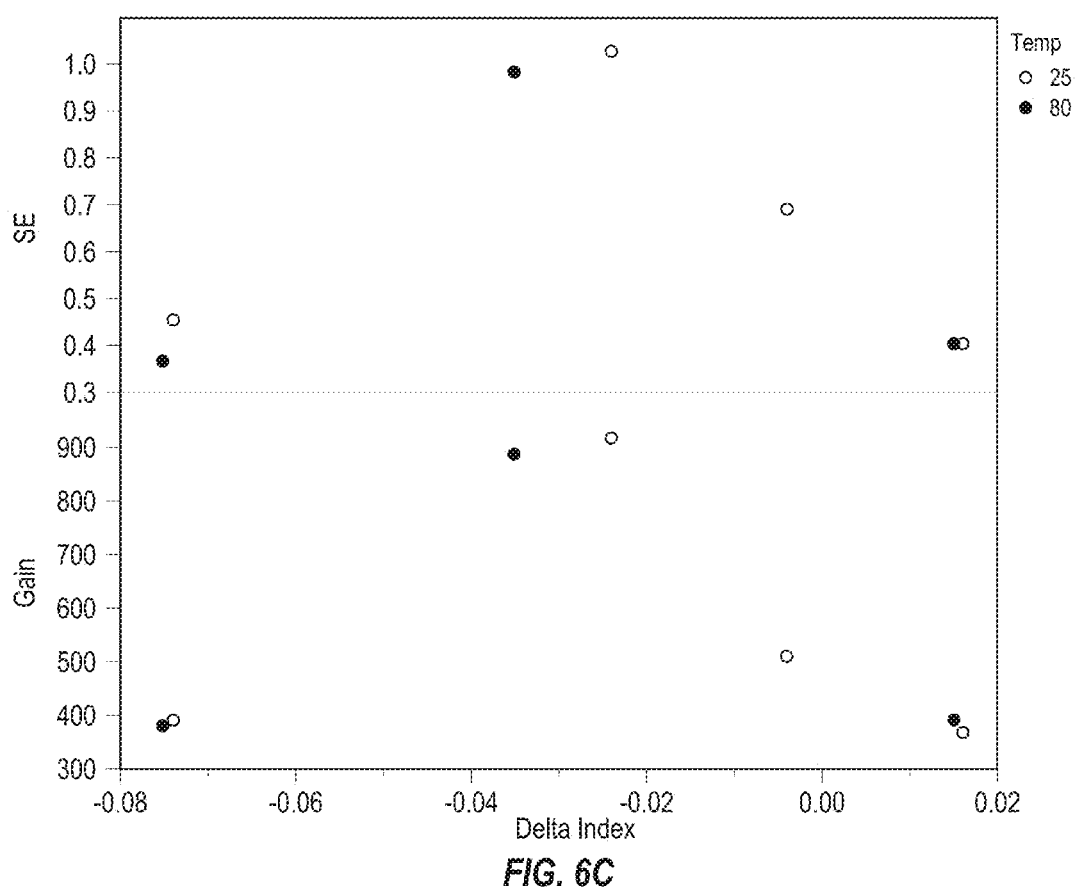
FIG. 6C includes a graph that shows that the coupled cavity stark shift index modulator can implement a change in slope efficiency due to a change in refractive index.

FIG. 6C shows that the coupled cavity stark shift index modulator can implement a change in slope efficiency due to a change in refractive index which means the primary cavity must have its gain adjusted to compensate for the varying loss of photons to keep the photon density constant thus avoiding relaxation ringing. As such, the gain can be modulated along with slope efficiency. An approximation for how this is done is (Idrive-Itran)=k*(slope efficiency) where k is adjusted for minimum ringing, Idrive is the drive current for the primary laser cavity, and Itran, is the drive current required to reach transparency for the primary active region.

Figure 7A:
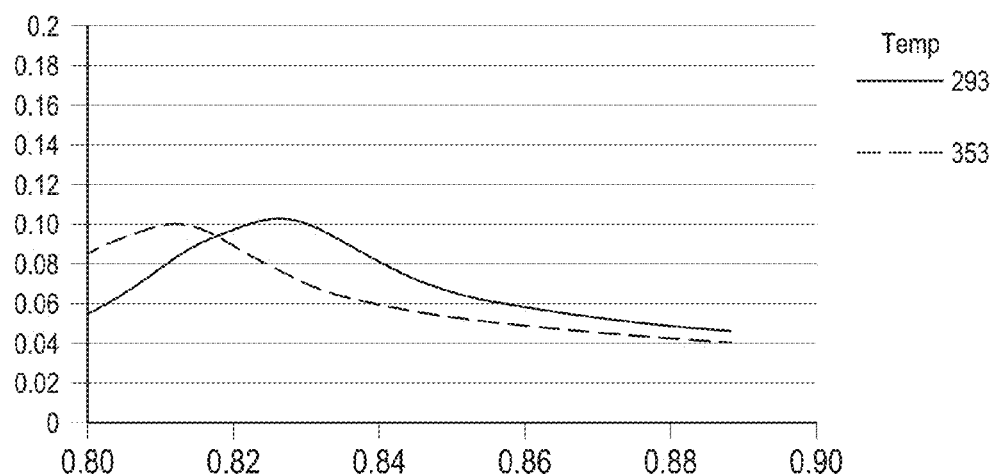
FIG. 7A-7B include graphs that show a coupled cavity Stark shifted modulated VCSEL can be operated in single drive mode.
Figure 7B:
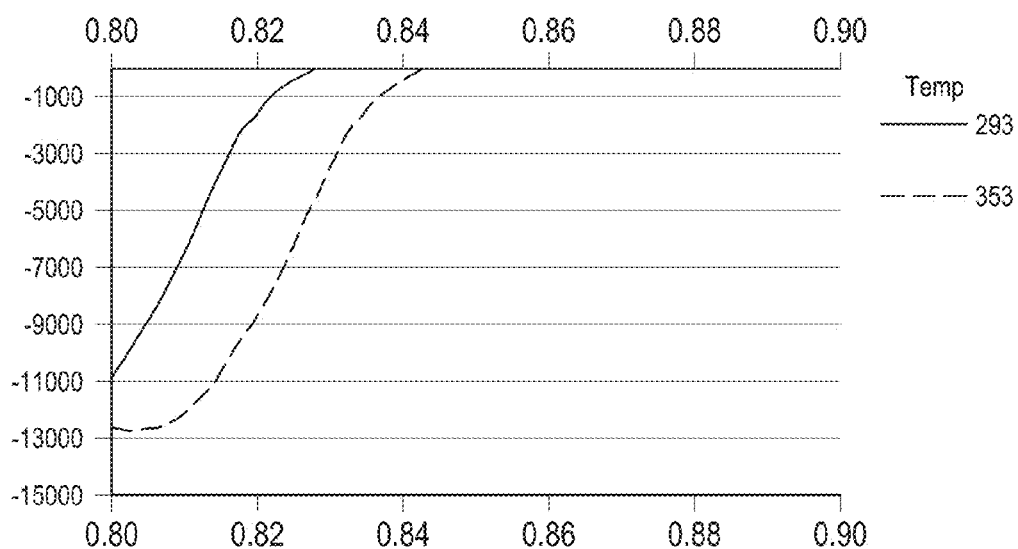

In one embodiment, the coupled cavity Stark shifted modulated VCSEL can be operated in single drive mode. Data shows that it is possible to play absorption and index change with field against each other to maintain constant back reflection and thus constant photon density in the primary cavity. This may be at suitable operating temperature, such as 293 to 353 K (see FIGS. 7A-7B). FIG. 7A shows an index change which can occur with a change in bias at temperature 293, and 353 K as a function of wavelength. This causes a shift in the resonant FP wavelength of the modulator cavity. If the shift causes the resonance of the primary laser and the modulator to get closer the transmission and thus the slope efficiency increases. Whether it gets closer or further from alignment depends on which side of the primary resonance it is placed. To allow single drive, keeping nominally constant back reflection, as the transmission of the modulator is increased by closer alignment of the resonances the absorption must also decrease and the short wavelength or long wavelength side of the primary laser FP is chosen to make this happen. Depending on the specific design of the quantum wells in the modulator it can be either side.

In one embodiment, the multi-cavity VCSEL can be operated in dual drive mode. This can facilitate keeping photon density in primary cavity constant by varying gain in the primary cavity along with slope efficiency caused by non-symmetric variation of bias in one or more electro-optic coupled cavities. The photon population in the primary cavity can remains constant. As such, ROF may not be important. The gain change becomes simply an RC delay as long as tunnel injection or other means to minimize spectral hole burning is used. It also allows use of only the index change, without absorption, for reasonable temperature compensation.

The multi-cavity VCSELs can include an integrated multi-cavity modulator, and allow for driving both the modulator and laser so that the photon density remains constant in the laser. That is, when the cavity loss increases due to the optical modulator causing higher output coupling, the gain can be increased to compensate in phase with it. This can be done without any ringing and without any optical isolation to avoid ringing due to back reflection. As such, back reflection issues can be avoided and the photon density in the primary cavity can be kept constant.

In one embodiment, for a constant drive current and a constant photon density the gain/top mirror reflectivity can be held constant.

The multi-cavity VCSEL can be prepared from any semiconductor material common with VCSEL semiconductor devices. As such, the semiconductor materials can include II-V semiconductor materials (e.g., prepared from one or more Group III material (boron (B), aluminum (Al), gallium (Ga), indium (In), thallium (Tl)) and one or more Group V materials (nitrogen (N), phosphorus (P), arsenic (As), antimony (Sb), bismuth (Bi)) and optionally some type IV materials. Particularly, the quantum wells, quantum well barriers, and confining regions can include these materials and main materials. Transition layers or wings separating the quantum wells and quantum well barriers, if included, may also include these materials. However, select regions or layers can be doped as described herein or in the incorporated references or known in the art.

In one embodiment, a VCSEL can include: an electro-optic modulator having two or more electro-optic modulator cavities between a lasing active region and a light emitting surface. In one aspect, each electro-optic modulator cavity has a mirror region and an electro-optically active region under the mirror region. In one aspect, the mirror region of each of the electro-optic modulator cavities is separated by one or more electrically insulating regions. In one aspect, one or more electrically insulating regions includes an insulating trench, wherein the insulating trench is a material different from the mirror regions. In one aspect, the trench is selected form air, silicon nitride, silicon dioxide, BCB, photoresist, titania (e.g., titanium dioxide) or combination thereof.

In one embodiment, the one or more electrically insulating regions includes an implant region. In one aspect, the implant region is implanted with a material that causes the implant region to be electrically insulating. In one aspect, the implant region is implanted with protons. In one aspect, the implant region is implanted with helium.

In one embodiment, each electro-optic modulator cavity has a modulator electrode.

In one embodiment, an electro-optic modulator has two or more electro-optic modulator cavities laterally disposed with respect to each other. In one aspect, each electro-optic modulator cavity is horizontally adjacent. In one aspect, the electro-optic modulator cavities are not longitudinally adjacent.

In one embodiment, the electro-optic modulator can include: a modulator mirror region having a top and a bottom; one or more insulator regions extending from the top to the bottom of the modulator mirror region so as to form two or more electro-optic modulator mirrors; at least one modulator electrode for each of the electro-optic modulator mirror cavities and electronically coupled therewith; and an electro-optically active region under the bottom of the modulator mirror region so as to form two or more laterally oriented electro-optic modulator cavities. In one aspect, the two or more electro-optic modulator mirrors and electro-optically active region thereunder forms the two or more electro-optic modulator cavities when placed at the top of the VCSEL. In one aspect, the electro-optically active region being uniform without being partitioned by an insulator. In one aspect, the electro-optically active region being partitioned by an insulator into two or more electro-optically active region cavities.

In one embodiment, the VCSEL of one of the embodiments can include a delay wave-plate over one or more of the electro-optic modulator cavities, the delay wave-plate providing a delay of ¼ wave or factor thereof. In one aspect, the delay wave-plate can be over only ½ of the electro-optic modulator cavities. In one aspect, the delay wave-plate can be over diagonally located electro-optic modulator cavities when four or more electro-optic modulator cavities are included.

In one embodiment, a VCSEL of one of the embodiments can include: a bottom electrode; a bottom mirror over the bottom electrode; a lasing active region over the bottom mirror, a middle mirror over the lasing active region; a lasing electrode coupled with the middle mirror. In one aspect, the electro-optic modulator can include: a modulator mirror region having a top and a bottom; one or more insulator regions extending from the top to the bottom of the modulator mirror region so as to form two or more electro-optic modulator mirror cavities; at least one modulator electrode for each of the electro-optic modulator mirror cavities and electronically coupled therewith; and an electro-optically active region under the bottom of the modulator mirror region. In one aspect, the bottom electrode to the middle mirror are located under a shelf structure and the electro-optic modulator is in a mesa structure over the shelf structure. In one aspect, the VCSEL can include a delay wave-plate over one or more of the electro-optic modulator cavities, the delay wave-plate providing a delay of wave or factor thereof.

In one embodiment, a method of manufacturing can prepare a VCSEL of one of the embodiments. Such a method can include: forming a semiconductor structure having a lasing active region; and forming the electro-optic modulator over the semiconductor structure. In one aspect, the method can include forming the electro-optically active region over the middle mirror; forming the modulator mirror region over the electro-optically active region; and forming the one or more insulator regions in the modulator mirror region. In one aspect, the method can include forming the one or more insulator regions by etching a trench in the modulator mirror region to form the two or more electro-optic modulator mirror cavities. In one aspect, the method can include filling the etched trench with an electronically insulating material. In one aspect, the electronically insulating material is selected from air, silicon nitride, silicon dioxide, BCB, photoresist, titania or combinations thereof. In one aspect, the method can include forming the one or more insulator regions by implanting the modulator mirror at locations for the insulating region. In one aspect, protons are implanted, and/or helium is implanted.

In one embodiment, a method of emitting light from the VCSEL of one of the embodiments can include: emitting a laser beam from the lasing active region; passing the laser beam through one or more of the electro-optic modulator cavities; and changing a refractive index of one or more of the electro-optic modulator cavities compared to one or more of the other electro-optic modulator cavities, such that the change in refractive index steers the laser beam. In one aspect, the method can include applying an electric field to the one or more of the electro-optic modulator cavities to change the refractive index thereof. In one aspect, the method can include applying an opposite bias to the one or more other electro-optic modulator cavities. In one aspect, the method can include steering the laser beam by at least 5 degrees. In one aspect, the method can include steering the laser beam by at least 7.5 degrees. In one aspect, the method can include steering the laser beam by at least 25 degrees. In one aspect, a delay wave-plate is included over one or more of the electro-optic modulator cavities.

In one aspect, the method can include providing a VCSEL having four or more electro-optic modulator cavities; and biasing diagonally-opposed electro-optic modulator cavities with a first bias without biasing other electro-optic modulator cavities with the first bias. In one aspect, the method can include biasing other electro-optic modulator cavities with a second bias while biasing the diagonally-opposed electro-optic modulator cavities with the first bias. In one aspect, the second bias is opposite of the first bias.

In one aspect, the method can include providing a VCSEL having a delay wave-plate over one or more of the electro-optic modulator cavities; and phase shifting light emitted from one or more of the electro-optic modulator cavities compared to other one or more of the electro-optic modulator cavities. In one aspect, the method can include converting the fundamental mode to at least a first angular mode. In one aspect, the method can include converting the fundamental mode to at least a second angular mode. In one aspect, the method can include phase shifting about 180 degrees. In one aspect, the method can include compensating for the delay wave-plate by an applied field to the electro-optic modulator to obtain about 0 phase change.

In one aspect, the method can include biasing a modulator electrode changes the refractive index of the electro-optically active region of the electro-optic modulator.

In one embodiment, a VCSEL can include: a primary VCSEL cavity; and at least one coupled electro-optic cavity which varies slope efficiency with applied bias to the at least one electro-optic cavity and the current bias applied to the primary VCSEL cavity is modulated to keep photon density in the primary VCSEL cavity nominally constant.

In one embodiment, a VCSEL can include: a primary VCSEL cavity; and at least one coupled electro-optic cavity which varies slope efficiency with applied bias to the at least one electro-optic cavity and the current bias applied to the primary VCSEL cavity is modulated to minimize ringing in a modulated signal emitted from the VCSEL.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

All references recited herein are incorporated herein by specific reference in their entirety: U.S. Pat. No. 7,061,945.

The invention claimed is:

1. A VCSEL comprising:
an electro-optic modulator between a lasing active region and a light emitting surface, the electro-optic modulator comprising:
an electro-optically active region;
a modulator mirror region over the electro-optically active region; and
at least one electrical insulator region located in the modulator mirror region separating the modulator mirror region into at least two separate modulator mirror cavities electrically isolated from each other, wherein each separate modulator mirror cavity and a longitudinally aligned portion of the electro-optically active region form an electro-optic modulator cavity.

2. The VCSEL of claim 1, wherein at least one electrical insulator region includes an electrical insulator trench having an electrical insulator material that is different from the mirror cavities.

3. The VCSEL of claim 2, wherein the electrical insulator material of the electrical insulator trench is selected from the group consisting of air, silicon nitride, silicon dioxide, BCB, photoresist, titania or combination thereof.

4. The VCSEL of claim 1, wherein at least one electrical insulator region includes an electrical insulator implant region, wherein the electrical implant region is implanted with a material that causes the electrical implant region to be electrically insulating.

5. The VCSEL of claim 4, wherein the implant region is implanted with protons and/or helium.

6. The VCSEL of claim 1, wherein each modulator mirror cavity has a modulator electrode.

7. The VCSEL of claim 1, wherein the at least two separate modulator mirror cavities are laterally disposed with respect to each other and relative to a longitudinal axis of emitted light.

8. The VCSEL of claim 1: the electro-optic modulator comprising:
the modulator mirror region having a top and a bottom; and
the at least one electrical insulator region extending from the top to the bottom of the modulator mirror region.

9. The VCSEL of claim 1, comprising:
a delay wave-plate over at least one of the separate modulator mirror cavities, the delay wave-plate providing a delay of ¼ wave or factor thereof, and
at least one of the separate modulator mirror cavities being devoid of a delay wave-plate thereover.

10. The VCSEL of claim 9, comprising a delay wave-plate over diagonally located separate modulator mirror cavities when four or more separate modulator mirror cavities are included.

11. The VCSEL of claim 1, comprising the electro-optic modulator in a mesa region of the VCSEL and the lasing active region being in a base region having a shoulder, the base region having the shoulder being under the mesa region.

12. The VCSEL of claim 1, comprising more than two separate modulator mirror cavities separated by the at least one electrical insulator region.

13. A method of manufacturing the VCSEL of claim 1, the method comprising:
- forming a semiconductor structure having the lasing active region and a middle mirror region over the lasing active region;
- forming the electro-optically active region over the middle mirror region; forming the modulator mirror region over the electro-optically active region so as to have a top having or being associated with the light emitting surface and to have a bottom; and
- forming the at least one electrical insulator region so as to be located in the modulator mirror region so as to split the modulator mirror region into the at least two modulator mirror cavities.

14. The method of claim 13, comprising:
- removing a portion of the modulator mirror region from the top to the bottom so as to form a trench between the at least two separate modulator mirror cavities; and
- filling the trench with an electrical insulator material so as to form the at least one electrical insulator region in the trench.

15. The method of claim 14, comprising:
- forming the one or more insulator regions by implanting a substance of the modulator mirror region so as to form an implant isolator.

16. A method of emitting light from a VCSEL, the method comprising:
- providing a VCSEL of claim 1;
- emitting a laser beam from the lasing active region along a longitudinal axis; and
- changing a refractive index of one electro-optic modulator cavity so as to steer the laser beam from the longitudinal axis.

17. The method of claim 16, comprising selectively biasing the one electro-optic modulator cavity so as to change the refractive index thereof relative to one or more other electro-optic modulator cavities.

18. The method of claim 17, comprising selectively biasing one modulator mirror cavity and a portion of the electro-optically active region that is longitudinally aligned with the biased modulator mirror cavity so as to change the refractive index relative.

19. The method of claim 17, comprising applying an opposite bias to one or more other electro-optic modulator cavities.

20. The method claim 16, comprising steering the laser beam by at least degrees.

21. The method of claim 16, wherein a delay wave-plate is included over the one electro-optic modulator cavity, wherein the delay wave-plate further steers the laser beam from the longitudinal axis.

22. The method of claim 16, comprising:
- providing a VCSEL having four or more electro-optic modulator cavities; and
- biasing diagonally-opposed electro-optic modulator cavities with a first bias without biasing other electro-optic modulator cavities with the first bias.

23. The method of claim 22, comprising biasing other electro-optic modulator cavities with a second bias while biasing the diagonally-opposed electro-optic modulator cavities with the first bias, wherein the second bias is opposite of the first bias.

24. The method of claim 16, comprising:
- providing a VCSEL having a delay wave-plate over one or more of the electro-optic modulator cavities; and
- phase shifting light emitted from one or more of the electro-optic modulator cavities compared to other one or more of the electro-optic modulator cavities.

25. The method of claim 24, comprising converting the fundamental mode to at least a first angular mode.

26. The method of claim 25, comprising converting the fundamental mode to at least a second angular mode.

27. The method of claim 24, wherein the phase shifting is about 180 degrees.

28. The method of claim 16, comprising:
- providing a VCSEL having a delay wave-plate over one or more of the electro-optic modulator cavities; and
- compensating for the delay wave-plate by an applied field to the electro-optic modulator to obtain about 0 phase change.

29. A VCSEL comprising:
an electro-optic modulator between a lasing active region and a light emitting surface, the electro-optic modulator comprising:
- an electro-optically active region;
- a modulator mirror region over the electro-optically active region;
- at least one insulator region located in the modulator mirror region separating the modulator mirror region into at least two separate modulator mirror cavities electrically isolated from each other, wherein each separate modulator mirror cavity and a longitudinally aligned portion of the electro-optically active region form an electro-optic modulator cavity, wherein the electro-optic modulator is configured for:
  - modulating bias on one of the electro-optic modulator cavities to change the refractive index of the one electro-optic modulator cavity;
  - varying slope efficiency with applied bias to one of the electro-optic modulator cavities while current bias applied to a primary VCSEL cavity is modulated to keep photon density in a primary VCSEL cavity nominally constant; or
  - varying slope efficiency with applied bias to one of the electro-optic modulator cavities while current bias applied to a primary VCSEL cavity is modulated to minimize ringing in a modulated signal emitted from the VCSEL.

30. A VCSEL comprising:
an electro-optic modulator between a lasing active region and a light emitting surface, the electro-optic modulator comprising:
- an electro-optically active region;
- a modulator mirror region over the electro-optically active region;
- at least one insulator region located in the modulator mirror region separating the modulator mirror region into at least two separate modulator mirror cavities electrically isolated from each other, wherein each separate modulator mirror cavity and a longitudinally aligned portion of the electro-optically active region form an electro-optic modulator cavity, wherein the electro-optic modulator is configured for:
  - modulating bias on one of the electro-optic modulator cavities to change the refractive index of the one electro-optic modulator cavity;
  - varying slope efficiency with applied bias to one of the electro-optic cavities while the absorption of the one electro-optic cavity is modulated by the same bias to add to the modulation of the transmitted light, but keep the reflection back into the primary laser cavity constant.

* * * * *